(12) United States Patent
Larson, III et al.

(10) Patent No.: US 7,242,270 B2
(45) Date of Patent: Jul. 10, 2007

(54) DECOUPLED STACKED BULK ACOUSTIC RESONATOR-BASED BAND-PASS FILTER

(75) Inventors: John D Larson, III, Palo Alto, CA (US); Stephen Ellis, Pleasanton, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 116 days.

(21) Appl. No.: 11/069,409

(22) Filed: Feb. 28, 2005

(65) Prior Publication Data

US 2005/0140466 A1  Jun. 30, 2005

Related U.S. Application Data

(63) Continuation-in-part of application No. 10/699,289, filed on Oct. 30, 2003, now Pat. No. 7,019,605, and a continuation-in-part of application No. 10/965,541, filed on Oct. 13, 2004.

(51) Int. Cl.
*H03H 9/54* (2006.01)
(52) U.S. Cl. .................. 333/187; 333/189; 333/192
(58) Field of Classification Search ............. 333/187, 333/189
See application file for complete search history.

(56) References Cited

U.S. PATENT DOCUMENTS

| | | |
|---|---|---|
| 3,174,122 A | 3/1965 | Fowler et al. |
| 3,189,851 A | 6/1965 | Fowler |
| 3,321,648 A | 5/1967 | Kolm |
| 3,422,371 A | 1/1969 | Poirier et al. |
| 3,568,108 A | 3/1971 | Poirier et al. |
| 3,610,969 A | 10/1971 | Clawson et al. |
| 4,456,850 A | 6/1984 | Inoue et al. |
| 4,719,383 A | 1/1988 | Wang et al. |
| 5,048,038 A | 9/1991 | Brennan et al. |
| 5,294,898 A | 3/1994 | Dworsky et al. |
| 5,587,620 A | 12/1996 | Ruby et al. |
| 5,671,242 A | 9/1997 | Takiguchi et al. |
| 5,864,261 A | 1/1999 | Weber |
| 5,872,493 A | 2/1999 | Ella |
| 5,873,154 A | 2/1999 | Ylilammi et al. |

(Continued)

FOREIGN PATENT DOCUMENTS

DE    10160617    5/2003

(Continued)

OTHER PUBLICATIONS

K.M. Lakin et al. "High Performance Stacked Crystal Filters For GPS And Wide Bandwidth Applications"; 2001 IEEE Ultrasonics Symposium; vol. 1, pp. 833-838, Oct. 7-10, 2001.*

(Continued)

*Primary Examiner*—Barbara Summons

(57) ABSTRACT

The band-pass filter has first terminals, second terminals, a first decoupled stacked bulk acoustic resonator (DSBAR), a second DSBAR, and an electrical circuit connecting the first DSBAR and the second DSBAR in series between the first terminals and the second terminals. Each DSBAR has a first film bulk acoustic resonator (FBAR), a second FBAR and an acoustic decoupler between the FBARs. Each FBAR has opposed planar electrodes and a piezoelectric element between the electrodes.

19 Claims, 16 Drawing Sheets

U.S. PATENT DOCUMENTS

| | | |
|---|---|---|
| 5,910,756 A | 6/1999 | Ella |
| 5,936,150 A | 8/1999 | Kobrin et al. |
| 5,953,479 A | 9/1999 | Zhou et al. |
| 6,040,962 A | 3/2000 | Kanazawa et al. |
| 6,087,198 A | 7/2000 | Panasik |
| 6,107,721 A | 8/2000 | Lakin |
| 6,187,513 B1 | 2/2001 | Katakura |
| 6,215,375 B1 | 4/2001 | Larson, III et al. |
| 6,262,637 B1 | 7/2001 | Bradley et al. |
| 6,278,342 B1 | 8/2001 | Ella |
| 6,292,336 B1 | 9/2001 | Horng et al. |
| 6,420,820 B1 | 7/2002 | Larson, III |
| 6,437,482 B1 | 8/2002 | Shibata |
| 6,441,539 B1 | 8/2002 | Kitamura et al. |
| 6,466,105 B1 | 10/2002 | Lobl et al. |
| 6,466,418 B1 | 10/2002 | Horng et al. |
| 6,483,229 B2 | 11/2002 | Larson, III et al. |
| 6,492,883 B2 | 12/2002 | Liang et al. |
| 6,548,942 B1 | 4/2003 | Panasik |
| 6,583,688 B2 | 6/2003 | Klee et al. |
| 6,670,866 B2 | 12/2003 | Ellaet et al. |
| 6,720,844 B1 * | 4/2004 | Lakin .................. 333/189 |
| 6,873,529 B2 | 3/2005 | Ikuta et al. |
| 6,888,424 B2 | 5/2005 | Takeuchi et al. |
| 6,900,705 B2 | 5/2005 | Nakamura et al. |
| 6,906,451 B2 | 6/2005 | Yamada et al. |
| 6,917,261 B2 | 7/2005 | Unterberger |
| 6,936,954 B2 | 8/2005 | Peczalski |
| 6,946,928 B2 * | 9/2005 | Larson et al. ............ 333/189 |
| 6,963,257 B2 * | 11/2005 | Ella et al. ............... 333/133 |
| 6,985,052 B2 | 1/2006 | Tikka |
| 6,987,433 B2 * | 1/2006 | Larson et al. ............ 333/189 |
| 6,989,723 B2 | 1/2006 | Komuro et al. |
| 7,091,649 B2 * | 8/2006 | Larson et al. ............ 310/324 |
| 2002/0190814 A1 | 12/2002 | Yamada et al. |
| 2003/0128081 A1 | 7/2003 | Ella et al. |
| 2004/0150293 A1 | 8/2004 | Stoemmer |
| 2004/0195937 A1 | 10/2004 | Matsubara et al. |
| 2005/0057117 A1 | 3/2005 | Nakatsuka et al. |
| 2005/0068124 A1 | 3/2005 | Stoemmer |
| 2005/0093654 A1 | 5/2005 | Larson, III et al. |
| 2005/0093655 A1 | 5/2005 | Larson, III et al. |
| 2005/0093658 A1 * | 5/2005 | Larson et al. ............ 333/191 |
| 2005/0093659 A1 | 5/2005 | Larson, III et al. |
| 2005/0104690 A1 * | 5/2005 | Larson et al. ............ 333/191 |
| 2005/0128030 A1 * | 6/2005 | Larson et al. ............ 333/191 |
| 2005/0193507 A1 | 9/2005 | Ludwiczak |
| 2006/0164183 A1 | 7/2006 | Tikka et al. |

FOREIGN PATENT DOCUMENTS

| | | |
|---|---|---|
| EP | 0 880 227 | 11/1998 |
| EP | 1 047 189 | 4/1999 |
| EP | 1 100 196 | 5/2001 |
| EP | 1 542 362 | 6/2003 |
| EP | 1 557 945 | 10/2003 |
| EP | 1 517 444 | 8/2004 |
| JP | 2002-217676 | 8/2002 |
| WO | WO 98/16957 | 4/1998 |
| WO | WO 03/050950 | 6/2003 |
| WO | WO 03/058809 | 7/2003 |
| WO | WO 2003/05880 | 7/2003 |
| WO | WO 03/030358 | 10/2003 |
| WO | WO 2004/034579 | 4/2004 |

OTHER PUBLICATIONS

K.M. Lakin "Coupled Resonator Filters"; 2002 IEEE Ultrasonics Symposium; vol. 1, pp. 901-908, Oct. 8-11, 2002.*

B. Hadimioglu et al., "Polymer Files As Acoustic Matching Layers", 1990 IEEE Ultrasonics Sysmposium Proceedings, vol. 3 pp. 1337-1340, Dec. 1990.

Jung, Jun-Phil, "Experimental and Theoretical INvestigation on the Relationship between AlN Properties and AlN-based FBAR Characterisitcs", IEEE Internations Frequency Control Symposium, May 4, 2003, pp. 779-784.

Krishnaswamy, S.V., et al., "Film Bulk Acoustic Wave Resonatior Technology", Ultrasonic Symposium, Proceedings 1990, pp. 529-535, vol. 1, Dec. 1990.

Lobl, H.P., et al., "Piezoelectri Material for BAW Resonators and Filters", IEEE Ultrasonics Symposium Oct. 5, 2003, pp. 807-811.

Martin et al., "Development of Low-Dielectric Constant Polymer for Fabrication of Intergrated Circuit Interconnect", 12 Advanced Materials, pp. 1769-1778, No. 23, Dec. 1, 2000.

Reinhardt, Alexandre et al., "Piezoelectric Material for BAW Resonators and Filters", IEEE Ultrasonics Symposium Oct. 5, 2003, pp. 807-811.

Yang, C.-M., Highly C-Axis-Oriented AlN Film Using MOCVD for 5GHz-Band FBAR Filter, IEEE Ultrasonics Symposium, Oct. 5, 2003, 99. 170-173.

Examination Report corresponding to application No. GB0605775.6 dated Aug. 30, 2006.

Examination Report corresponding to application No. GB0605770.7 dated Aug. 25, 2006.

Examination Report from corresponding application No. GB0605779.8 dated Aug. 23, 2006.

Examination Report from corresponding application No. GB0605971.1 dated Aug. 24, 2006.

* cited by examiner

DECOUPLED STACKED BULK ACOUSTIC RESONATOR-BASED BAND-PASS FILTER

RELATED APPLICATIONS

This application is a Continuation-in-Part of U.S. patent application Ser. No. 10/699,289, filed on Oct. 30, 2003 and now U. S. Pat. No. 7,019,605, of John D. Larson III entitled Stacked Bulk Acoustic Resonator Band-Pass Filter with Controllable Pass Bandwidth and of U.S. patent application Ser. No. 10/965,541, filed on Oct. 13, 2004 (currently pending), of John D. Larson III and Stephen Ellis entitled Decoupled Stacked Bulk Acoustic Resonator Band-Pass Filter with Controllable Pass Bandwidth. The applications are both assigned to the assignee of this application and are incorporated by reference.

BACKGROUND

Band-pass filters are used in an ever-widening variety of electronic products, especially wireless products. An ideal band-pass filter provides little or no attenuation of signals at frequencies in the pass band, has a flat frequency response in the pass band, and provides a large attenuation of signals at frequencies outside the pass-band. Additionally, in an ideal band-pass filter, the slope of the transition between the pass band and the stop band is steep.

Band-pass filters that incorporate one or more film bulk acoustic resonators (FBARs) have characteristics that approximate the above-described ideal characteristics yet are small in size and are relatively inexpensive. For example, modern cellular telephones incorporate a duplexer composed of two band-pass filters. Each of the band-pass filters includes a ladder circuit in which each element of the ladder circuit is an FBAR. A duplexer incorporating FBARs is disclosed by Bradley et al. in U. S. Pat. No. 6,262,637 entitled Duplexer Incorporating Thin-film Bulk Acoustic Resonators (FBARs), assigned to the assignee of this disclosure and incorporated by reference. Such duplexer is composed of a transmitter band-pass filter connected between the output of the transmitter and the antenna and a receiver band-pass filter and a 90° phase-shifter connected in series between the antenna and the input of the receiver. The center frequencies of the pass-bands of the transmitter band-pass filter and the receiver band-pass filter are offset from one another. Band-pass filters incorporating ladder filters based on FBARs are also used in other applications.

FIG. 1 shows an exemplary embodiment of an FBAR-based band-pass filter 10 suitable for use as the transmitter band-pass filter of a duplexer. The transmitter band-pass filter is composed of series FBARs 12 and shunt FBARs 14 connected in a ladder circuit. Series FBARs 12 have a higher resonant frequency than shunt FBARs 14. FBAR-based ladder filters are widely used in the duplexers of CDMA mobile telephones where their small physical size, large power handling capability, low cost, low insertion loss and frequency response characteristics are advantageous.

FIG. 2 is a graph showing the frequency response of FBAR-based band-pass filter 10. The frequency response exhibits a flat response in the pass band and an initial steep fall in the response in the transition between the pass band and the stop band. However, the characteristics of the band-pass filter 10 deviate from the above-described ideal characteristics because, after the initial fall, the subsequent rise in the frequency response in the stop band may result in insufficient stop band attenuation for some applications.

FIG. 3 shows an exemplary embodiment 30 of an FBAR. FBAR 30 is composed a pair of electrodes 32 and 34 and a piezoelectric element 36 between the electrodes. FIG. 3 also shows a substrate 40 that supports FBAR 30 in a way that mechanically decouples the FBAR from the substrate. Mechanically decoupling FBAR 30 from substrate 40 allows the FBAR to resonate mechanically in response to an electrical signal applied between electrodes 32 and 34. In the example shown, FBAR 30 is mechanically decoupled from substrate 40 by suspending the FBAR over a cavity 42 defined in the substrate. Other ways of mechanically decoupling the FBAR from the substrate are known.

FIG. 4 shows an exemplary embodiment 50 of a band-pass filter that incorporates a decoupled stacked bulk acoustic resonator (DSBAR) as described in above-mentioned U.S. patent application Ser. No. 10/699,289 and above-mentioned U.S. patent application Ser. No. 10/965,541. Band-pass filter 50 is based on a DSBAR 52 composed of a lower FBAR 54, an upper FBAR 56 stacked on lower FBAR 54 and an acoustic decoupler 58 between the FBARs. Each of the FBARs is similar in structure to FBAR 30 described above with reference to FIG. 3. DSBAR 52 is shown suspended over cavity 42 in substrate 40 in a manner similar to that described above. When an electrical input signal is applied between the electrodes of lower FBAR 54, upper FBAR 56 provides a band-pass filtered electrical output signal between its electrodes. The pass bandwidth of band-pass filter 50 is determined by the coupling of acoustic energy between lower FBAR 54 and upper FBAR 56. The coupling is controlled by acoustic decoupler 58. The electrical input signal may alternatively be applied between the electrodes of the upper FBAR, in which case, the electrical output signal is taken from the electrodes of the lower FBAR.

FIG. 5 is a graph showing the frequency response of DSBAR-based band-pass filter 50. The frequency response exhibits a flat response in the pass-band and a fall in the response at frequencies above and below the pass band. However, the characteristics of the DSBAR-based band-pass filter deviate from the above-described ideal characteristics in that the transition between the pass band and the stop band is less steep than some applications require. The response falls less steeply than the initial fall in the response shown in FIG. 2 of the FBAR-based ladder filter described above with reference to FIG. 1.

Accordingly, what is needed is a band-pass filter whose characteristics more closely approximate the above-described ideal characteristics. In particular, what is needed is a band-pass filter having the advantages of the above-described band-pass filters but whose frequency response in the transition between the pass band and the stop band falls more steeply than that of DSBAR-based band-pass filter 50 and that provides a greater attenuation in the stop band than FBAR-based band-pass filter 10.

SUMMARY OF THE INVENTION

In a first aspect, the invention provides a band-pass filter having a 1:1 impedance transformation ratio. The band-pass filter comprises first terminals, second terminals, a first decoupled stacked bulk acoustic resonator (DSBAR), a second DSBAR, and an electrical circuit connecting the first DSBAR and the second DSBAR in series between the first terminals and the second terminals. Each DSBAR comprises a first film bulk acoustic resonator (FBAR), a second FBAR and an acoustic decoupler between the FBARs. Each FBAR comprises opposed planar electrodes and a piezoelectric element between the electrodes.

In a second aspect, the invention provides a band-pass filter having a 1:4 or 4:1 impedance transformation ratio. The band-pass filter comprises first terminals, second terminals, a first decoupled stacked bulk acoustic resonator (DSBAR), a second DSBAR, a third DSBAR, a fourth DSBAR, a first electrical circuit connecting the first DSBAR and the second DSBAR in series between the first terminals and the second terminals; and a second electrical circuit connecting the third DSBAR and the fourth DSBAR in series between the first terminals and the second terminals. One of the first electrical circuit and the second electrical circuit is phase-inverting relative to the other. Each DSBAR comprises a first film bulk acoustic resonator (FBAR), a second FBAR and an acoustic decoupler between the FBARs. Each FBAR comprises a first electrode, a second electrode and a piezoelectric element between the electrodes.

In a third aspect, the invention provides a band-pass filter having a 1:4 or 4:1 impedance transformation ratio. The band-pass filter comprises first terminals, second terminals, a first filter module, a second filter module, a first electrical circuit and a second electrical circuit. Each filter module comprises third terminals, fourth terminals, and a first decoupled stacked bulk acoustic resonator (DSBAR) and a second DSBAR electrically connected in series between the third terminals and the fourth terminals. The first electrical circuit connects the third terminals of the first filter module and the third terminals of the second filter module in parallel with the first terminals. The second electrical circuit connects the fourth terminals of the first filter module and the fourth terminals of the second filter module in series with the second terminals. One of the electrical circuits comprises a phase-inverting connection.

Embodiments of a band-pass filter in accordance with the invention have characteristics that approximate the above-described ideal characteristics more closely. In particular, such embodiments combine the advantages of the above-described FBAR-based band-pass filters with a frequency response that falls steeply in the transition between the pass band and the stop band and a large attenuation in the stop band.

DETAILED DESCRIPTION

Figure 6:
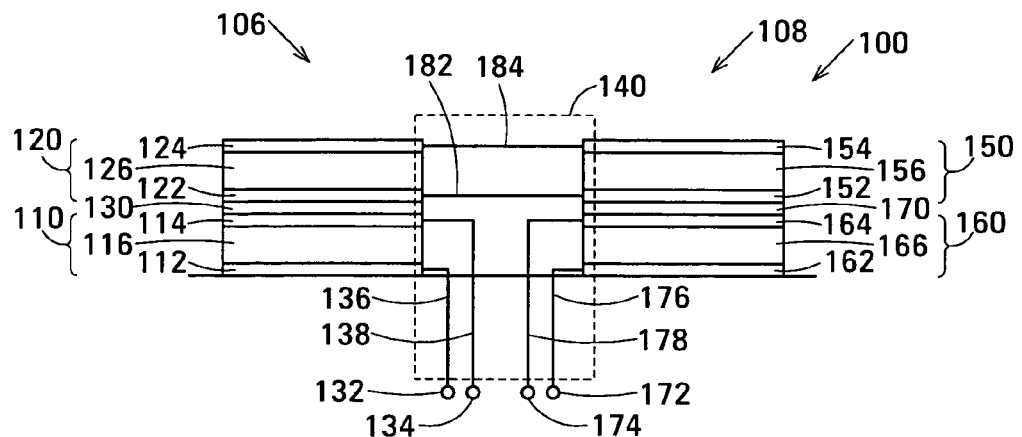
FIG. 6 is a schematic drawing of a first embodiment of a DSBAR-based band-pass filter in accordance with the invention.

FIG. 6 is a schematic drawing of a first embodiment 100 of a DSBAR-based band-pass filter in accordance with the invention. Band-pass filter 100 is composed of a first decoupled stacked bulk acoustic resonator (DSBAR) 106 and a second DSBAR 108. Each DSBAR comprises a first film bulk acoustic resonator (FBAR), a second FBAR and an acoustic decoupler between the FBARs. Each FBAR has opposed planar electrodes and a piezoelectric element between the electrodes. Band-pass filter 100 additionally has first terminals 132 and 134, second terminals 172 and 174, and an electrical circuit 140 that connects first DSBAR 106 and second DSBAR 108 in series between first terminals 132, 134 and second terminals 172, 174.

The embodiment of band-pass filter 100 shown in FIG. 6 has a 1:1 ratio between the impedance between first terminals 132, 134 and the impedance between second terminals 172, 174. Band-pass filter 100 will now be described in further detail with reference to the example shown in FIG. 6 in which first terminals 132, 134 are designated input terminals and second terminals 172, 174 are designated output terminals. Alternatively, first terminals 132, 134 may be designated output terminals, in which case, second terminals 172, 174 are designated input terminals.

In band-pass filter 100, first DSBAR 106 is composed of a first FBAR 110, a second FBAR 120 and an acoustic decoupler 130 between the FBARs. Second DSBAR 108 is composed of a first FBAR 150, a second FBAR 160 and an acoustic decoupler 170 between the FBARs. In the example shown, second FBAR 120 is stacked on first FBAR 110 and first FBAR 150 is stacked on second FBAR 160. Alternatively, first FBAR 110 may be stacked on second FBAR 120 and second FBAR 160 may be stacked on first FBAR 150.

In first DSBAR 106, first FBAR 110 is composed of opposed planar electrodes 112 and 114 and a piezoelectric element 116 between electrodes 112 and 114, and second FBAR 120 is composed of opposed planar electrodes 122 and 124 and a piezoelectric element 126 between electrodes 122 and 124. In second DSBAR 108, first FBAR 150 is composed of opposed planar electrodes 152 and 154 and a piezoelectric element 156 between electrodes 152 and 154, and second FBAR 160 is composed of opposed planar electrodes 162 and 164 and a piezoelectric element 166 between electrodes 162 and 164.

Electrical circuit 140 is composed of conductors 136, 138, 176, 178, 182 and 184. Conductors 136 and 138 respectively electrically connect first terminals 132 and 134 to the electrodes 112 and 114, respectively, of the first FBAR 110 of first DSBAR 106. Conductors 182 and 184 connect DSBARs 106 and 108 in series by respectively connecting the electrode 122 of second FBAR 120 to the electrode 152 of first FBAR 150 and connecting the electrode 124 of second FBAR 120 to the electrode 154 of first FBAR 150. Conductors 176 and 178 respectively electrically connect the electrodes 162 and 164, respectively, of the second FBAR 160 of second DSBAR 108 to output terminals 172 and 174.

In first DSBAR 106, an electrical input signal received at input terminals 132 and 134 is fed via conductors 136 and 138, respectively, to the electrodes 112 and 114 of first FBAR 110. In first FBAR 110, electrodes 112 and 114 apply the electrical input signal to piezoelectric element 116. The electrical input signal applied to piezoelectric element 116 causes first FBAR 110 to vibrate mechanically. Acoustic decoupler 130 couples the mechanical vibration of first FBAR 110 to second FBAR 120 and FBAR 120 vibrates in anti-phase to FBAR 110. The piezoelectric element 126 of second FBAR 120 converts the mechanical vibration of second FBAR 120 to an intermediate electrical signal that is received by the electrodes 122 and 124 of second FBAR 120. Electrical circuit 140 couples the intermediate electrical signal from the electrodes 122 and 124 of the second FBAR 120 of first DSBAR 106 to the electrodes 152 and 154, respectively, of the first FBAR 150 of second DSBAR 108.

In second DSBAR 108, first FBAR 150 vibrates mechanically in response to the intermediate electrical signal applied to its piezoelectric element 156. Acoustic decoupler 170 couples the mechanical vibration of first FBAR 150 to second FBAR 160, and second FBAR 160 vibrates in antiphase to FBAR 150 and, hence, in phase with FBAR 110. The piezoelectric element 166 of second FBAR 160 converts the mechanical vibration of second FBAR 160 to an electrical output signal that is received by the electrodes 162 and 164 of FBAR 160. Conductors 176 and 178 connect the electrical output signal from electrodes 162 and 164 to output terminals 172 and 174, respectively. The electrical output signal is in phase with the electrical input signal.

Figure 1:
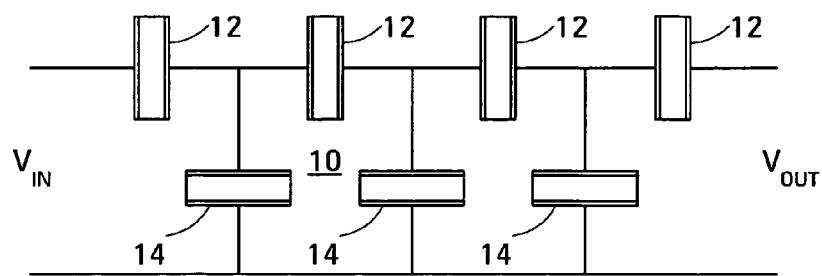
FIG. 1 is a schematic drawing of an exemplary embodiment of a band-pass filter incorporating an FBAR-based ladder filter.
Figure 2:
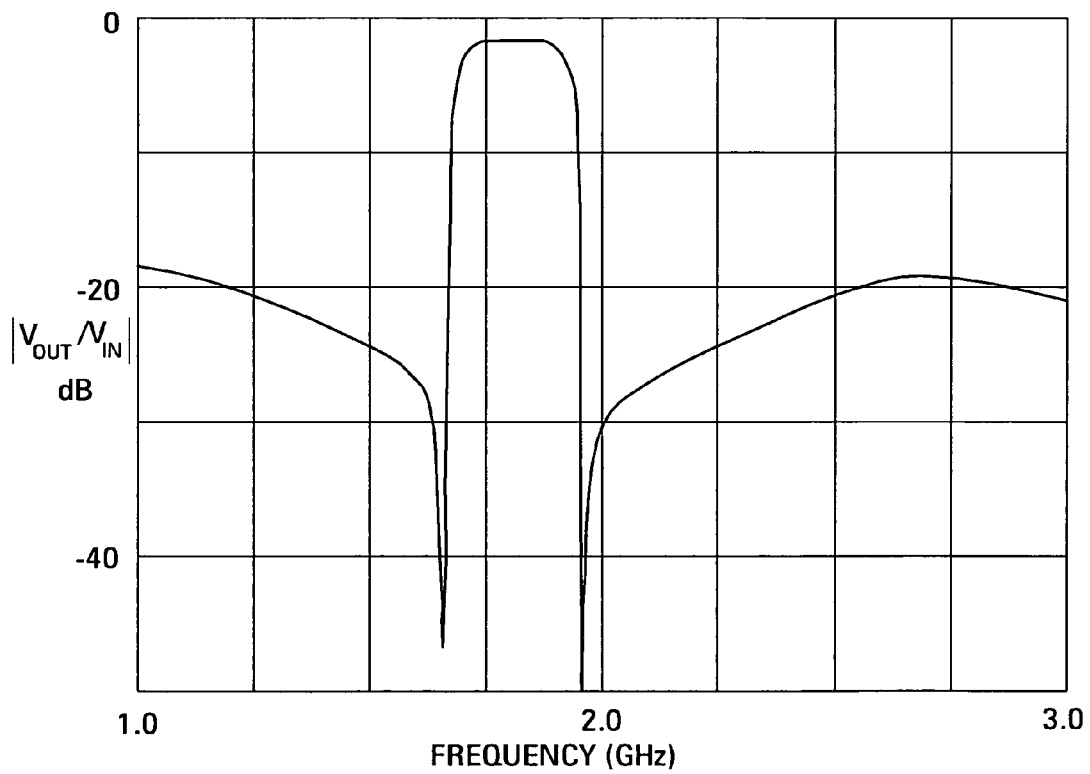
FIG. 2 is a graph showing the frequency response of an example of the FBAR-based ladder filter shown in FIG. 1.
Figure 3:
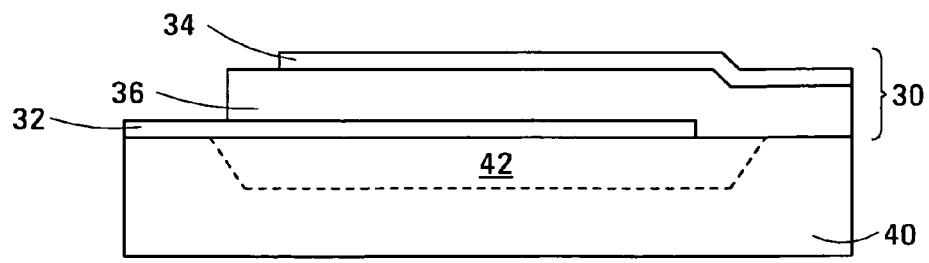
FIG. 3 is a schematic drawing of an exemplary embodiment of an FBAR.
Figure 4:
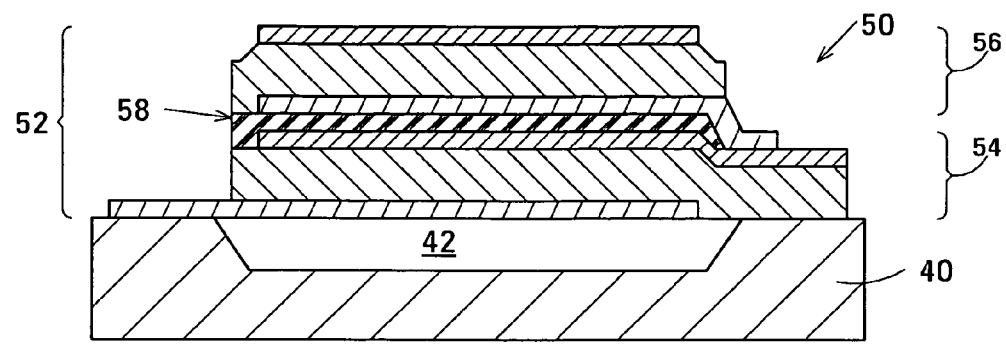
FIG. 4 is a schematic drawing of an exemplary embodiment of a band-pass filter incorporating a DSBAR.
Figure 5:
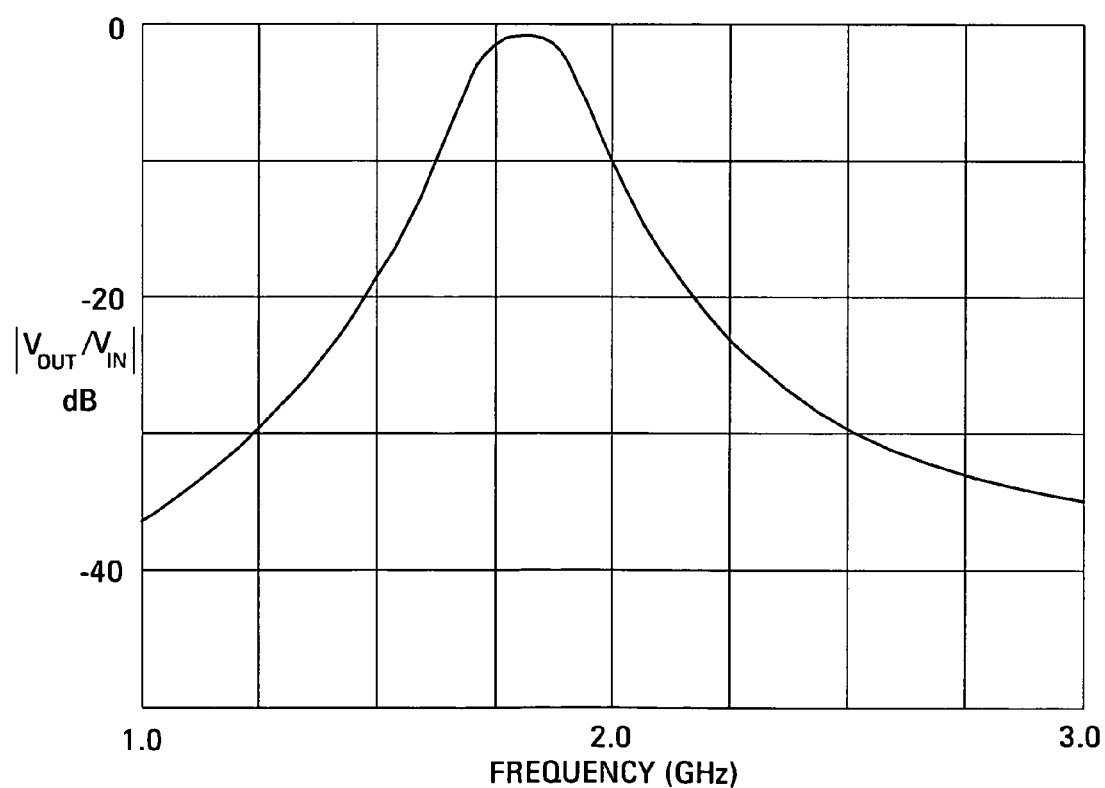
FIG. 5 is a graph showing the frequency response of an example of the band-pass filter shown in FIG. 4.
Figure 7:
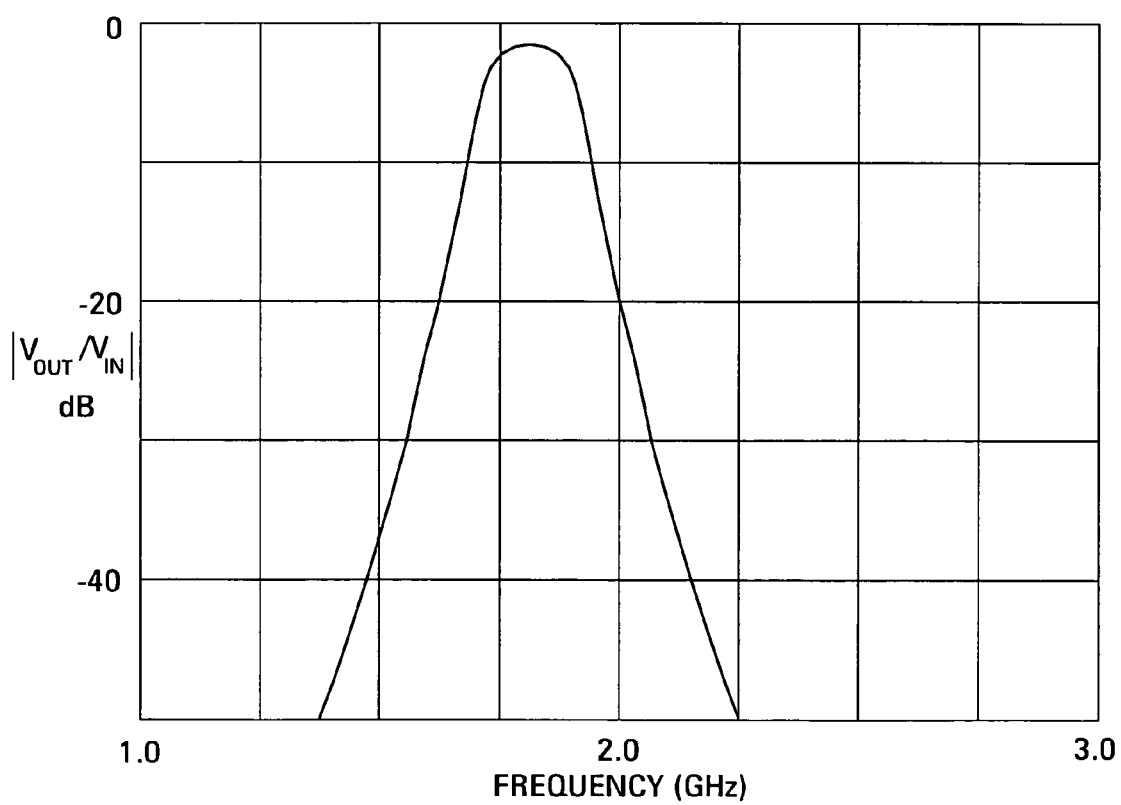
FIG. 7 is a graph showing the frequency response of an example of the DSBAR-based band-pass filter shown in FIG. 6.

The electrical input signal passes through DSBARs 106 and 108 connected in series between input terminals 132 and 134 and output terminals 172 and 174. Each of the DSBARs subjects the electrical signal passing through it to a respective band-pass filter characteristic similar to that shown in FIG. 5. FIG. 7 shows the resulting frequency response of band-pass filter 100. It can be seen that band-pass filter more closely approximates the above-described ideal characteristics of a band-pass filter. Band-pass filter 100 has a flat in-band response and a steep transition between the pass band and the stop band. Moreover, unlike the ladder filter response shown in FIG. 3, the frequency response continues to fall as the frequency deviation from the center frequency increases, resulting in a large attenuation in the stop band.

Figure 8A:
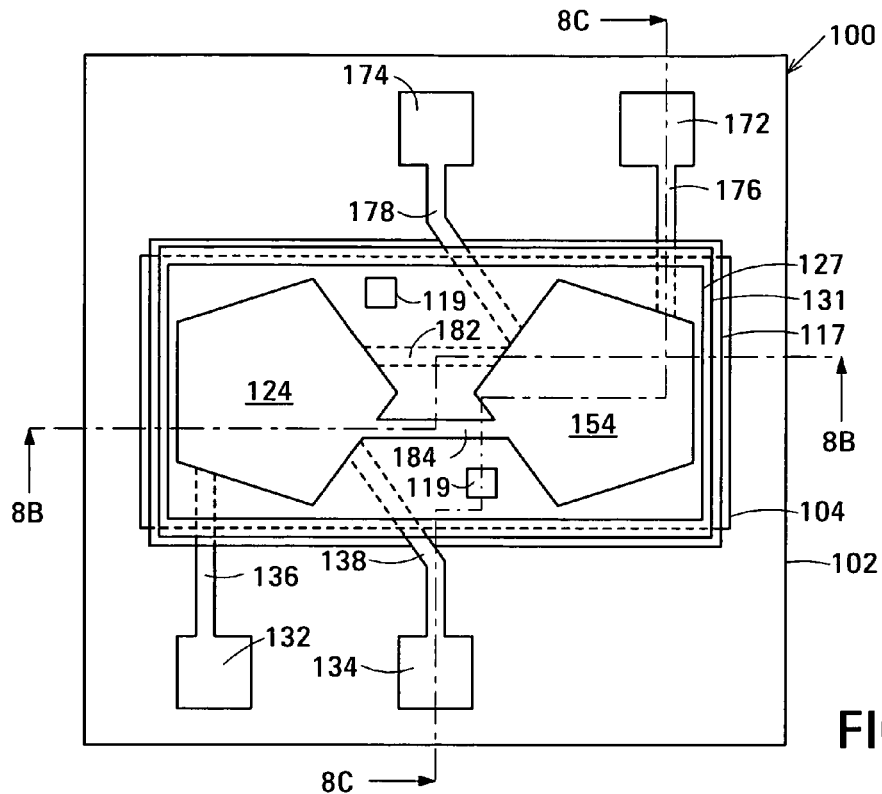
FIG. 8A is a plan view of a practical example of the first embodiment of the band-pass filter in accordance with the invention shown in FIG. 6.
Figure 8B:
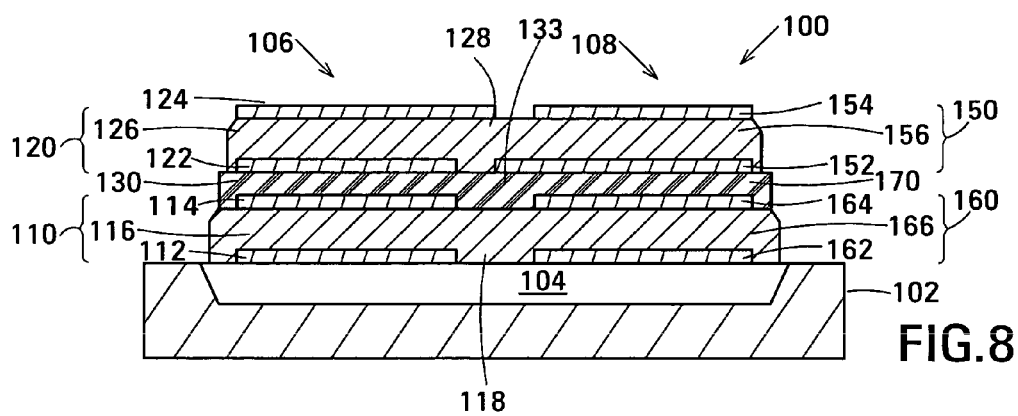
FIGS. 8B and 8C are cross-sectional views along the section lines 8B—8B and 8C—8C, respectively, of the practical example of the embodiment shown in FIG. 8A of a band-pass filter in accordance with the invention.
Figure 8C:
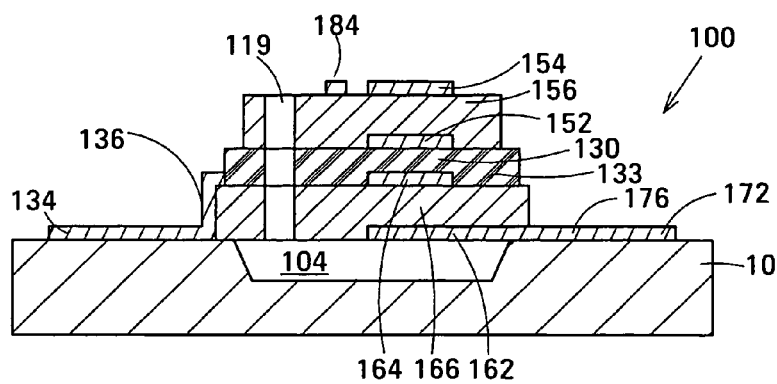

FIGS. 8A–8C are respectively a plan view and two cross-sectional views of a practical example of the first embodiment 100 of a band-pass filter in accordance with the invention. Elements of the example shown in FIGS. 8A–8C that correspond to elements of the embodiment shown in FIG. 6 are indicated using the same reference numerals and will not be described again in detail.

In band-pass filter 100, in DSBAR 106, acoustic decoupler 130 controls the coupling of acoustic energy between FBARs 110 and 120. Acoustic decoupler 130 couples less acoustic energy between the FBARs 110 and 120 than would be coupled if the FBARs were in direct contact with one another. Similarly, in DSBAR 108, acoustic decoupler 170 controls the coupling of acoustic energy between FBARs 150 and 160. Acoustic decoupler 170 couples less acoustic energy between the FBARs 150 and 160 than would be coupled if the FBARs were in direct contact with one another. The coupling of acoustic energy defined by acoustic decouplers 130 and 170 determines the pass bandwidths of DSBARs 106 and 108, respectively, and, hence, the pass bandwidth of band-pass filter 100.

In the example shown in FIGS. 8A–8C, acoustic decouplers 130 and 170 are respective parts of an acoustic decoupling layer 133. Acoustic decoupling layer 133 is a layer of acoustic decoupling material. One important property of the acoustic decoupling material of acoustic decoupling layer 133 is that its acoustic impedance differs significantly from that of FBARs 110, 120, 150 and 160. In some applications, other important properties of the acoustic decoupling material are a high electrical resistivity and low dielectric permittivity to provide galvanic isolation between the input terminals 132 and 134 and the output terminals 172 and 174 of the band-pass filter 100.

Acoustic decoupling layer 133 has a nominal thickness t between electrodes 114 and 122 and between electrodes 152 and 164 equal to an odd integral multiple of one quarter of the wavelength $\lambda_n$ in the acoustic decoupling material of an acoustic signal equal in frequency to the center frequency of the pass band of band-pass filter 100, i.e., $t \approx (2m+1)\lambda_n/4$, where m is an integer equal to or greater than zero. Such an acoustic decoupling layer imposes a phase change of an odd integral multiple of $\pi/2$ radians on an acoustic signal having a frequency nominally equal to the center frequency of the pass band of band-pass filter 100. Spurious responses are minimized in embodiments in which the thickness of acoustic decoupling layer 133 is equal to $\lambda_n/4$, i.e., in which m=0. An acoustic decoupling layer that differs from the nominal thickness by approximately ±10% of $\lambda_n/4$ can alternatively be used. A thickness tolerance outside this range can be used with some degradation in performance, but the thickness of acoustic decoupling layer 133 should differ significantly from an integral multiple of $\lambda_n/2$.

Many plastic materials have acoustic impedances significantly less than the acoustic impedance of FBARs 110, 120, 150 and 160 and can be applied in layers of uniform thickness in the thickness ranges stated above. Such plastic materials are therefore potentially suitable for use as the acoustic decoupling material of acoustic decoupling layer 133 that provides acoustic decouplers 130 and 170. However, the acoustic decoupling material must also be capable of withstanding the temperatures of the fabrication operations performed after acoustic decoupling layer 133 has been deposited on electrodes 114 and 164 to form acoustic decouplers 130 and 170. Electrodes 122, 124, 152 and 154 and piezoelectric elements 126 and 156 are deposited by sputtering after acoustic decoupling layer 133 has been deposited. Temperatures as high as 300° C. are reached during these deposition processes. Thus, a plastic that remains stable at such temperatures is used as the acoustic decoupling material.

In one embodiment, a polyimide is used as the acoustic decoupling material of layer 133. Polyimide is sold under the trademark Kapton® by E. I. du Pont de Nemours and Company. In such embodiment, acoustic decouplers 130 and 170 are composed of layer 133 of polyimide applied to electrodes 114 and 164 by spin coating. Polyimide has an acoustic impedance of about 4 megarayleigh (Mrayl).

In another embodiment, a poly(para-xylylene) is used as the acoustic decoupling material of layer 133. In such embodiment, acoustic decouplers 130 and 170 are composed of layer 133 of poly(para-xylylene) applied to electrodes 114 and 164 by vacuum deposition. Poly(para-xylylene) is also known in the art as parylene. The dimer precursor di-para-xylylene from which parylene is made and equipment for performing vacuum deposition of layers of parylene are available from many suppliers. Parylene has an acoustic impedance of about 2.8 Mrayl.

In another embodiment, the acoustic decoupling material of acoustic decoupling layer 133 is a crosslinked polyphenylene polymer. In such embodiment, acoustic decoupling layer 133 is a layer of a crosslinked polyphenylene polymer. Crosslinked polyphenylene polymers have been developed as low dielectric constant dielectric materials for use in integrated circuits and consequently remain stable at the high temperatures to which acoustic decoupling layer 133 is subject during the subsequent fabrication of FBARs 120 and 150. The inventors have discovered that crosslinked polyphenylene polymers additionally have a calculated acoustic impedance of about 2 Mrayl. This acoustic impedance is in the range of acoustic impedances that provides band-pass filter 100 with a useful pass bandwidth.

Precursor solutions containing various oligomers that polymerize to form respective crosslinked polyphenylene polymers are sold by The Dow Chemical Company, Midland, Mich., under the trademark SiLK. The precursor solutions are applied by spin coating. The crosslinked polyphenylene polymer obtained from one of these precursor solutions designated SiLK™ J, which additionally contains an adhesion promoter, has a calculated acoustic impedance of 2.1 Mrayl.

The oligomers that polymerize to form crosslinked polyphenylene polymers are prepared from biscyclopentadienone- and aromatic acetylene-containing monomers. Using such monomers forms soluble oligomers without the need for undue substitution. The precursor solution contains a specific oligomer dissolved in gamma-butyrolactone and cyclohexanone solvents. The percentage of the oligomer in the precursor solution determines the layer thickness when the precursor solution is spun on. After application, applying heat evaporates the solvents, then cures the oligomer to form a cross-linked polymer. The biscyclopentadienones react with the acetylenes in a 4+2 cycloaddition reaction that forms a new aromatic ring. Further curing results in the cross-linked polyphenylene polymer. Godschalx et al. disclose the above-described crosslinked polyphenylene polymers in U.S. Pat. No. 5,965,679, incorporated by reference. Additional practical details are described by Martin et al., *Development of Low-Dielectric Constant Polymer for the Fabrication of Integrated Circuit Interconnect*, 12 ADVANCED MATERIALS, 1769 (2000), also incorporated by reference. Compared with polyimide, crosslinked polyphenylene polymers have a lower acoustic impedance, a lower acoustic attenuation and a lower dielectric constant. Moreover, a spun-on layer of the precursor solution is capable of producing a high-quality film of the crosslinked polyphenylene polymer with a thickness of the order of 200 nm, which is a typical thickness of acoustic decoupling layer 133.

In another embodiment, acoustic decouplers 130 and 170 are composed of acoustic decoupling layers (not shown) of acoustic decoupling materials having different acoustic impedances, as described in U.S. patent application Ser. No. 10/965,449 of John D. Larson III and Stephen Ellis entitled Pass Bandwidth Control in Decoupled Stacked Bulk Acoustic Resonator Devices. The acoustic impedances and thicknesses of the acoustic decoupling layers collectively define the acoustic impedance of, and phase change imposed by, acoustic decouplers 130 and 170. The acoustic impedance of the acoustic decouplers in turn defines the pass bandwidth of band-pass filter 100.

In an exemplary embodiment of acoustic decouplers composed of acoustic decoupling layers of acoustic decoupling materials having different acoustic impedances, the acoustic decouplers were composed of an acoustic decoupling layer of crosslinked polyphenylene polymer atop an acoustic decoupling layer of polyimide. Such acoustic decouplers provide an embodiment of band-pass filter 100 with a pass bandwidth intermediate between the pass bandwidths of embodiments in which the acoustic decouplers are composed of single acoustic decoupling layer 133 of polyimide or are composed of single acoustic decoupling layer 133 of the crosslinked polyphenylene polymer.

In an alternative embodiment, the acoustic impedance of the acoustic decoupling material of acoustic decoupling layer 133 is substantially greater than that of the materials of FBARs 110, 120, 150 and 160. No materials having this property are known at this time, but such materials may become available in future, or FBAR materials with lower acoustic impedances may become available in future. The thickness of acoustic decoupling layer 133 of such high acoustic impedance acoustic decoupling material is as described above.

In another embodiment (not shown), acoustic decouplers 130 and 170 each include a Bragg structure composed of a low acoustic impedance Bragg element sandwiched between high acoustic impedance Bragg elements as described in above-mentioned U.S. patent application Ser. No. 10/699,289. The low acoustic impedance Bragg element is a layer of a low acoustic impedance material whereas the high acoustic impedance Bragg elements are each a layer of high acoustic impedance material. The acoustic impedances of the Bragg elements are characterized as "low" and "high" with respect to one another and additionally with respect to the acoustic impedance of the piezoelectric material of piezoelectric elements 116, 126, 156 and 166. In some applications, at least one of the Bragg elements additionally has a high electrical resistivity and a low dielectric permittivity to provide electrical isolation between the input terminals 132 and 134 and the output terminals 172 and 174 of band-pass filter 100.

Each of the layers constituting the Bragg elements has a nominal thickness equal to an odd integral multiple of one quarter of the wavelength in the material of the layer of an acoustic signal equal in frequency to the center frequency of band-pass filter 100. Layers that differ from the nominal thickness by approximately ±10% of one quarter of the wavelength can alternatively be used. A thickness tolerance outside this range can be used with some degradation in performance, but the thickness of the layers should differ significantly from an integral multiple of one-half of the wavelength.

In an embodiment, the low acoustic impedance Bragg element is a layer of silicon dioxide ($SiO_2$), which has an acoustic impedance of about 13 Mrayl, and each of the high acoustic impedance Bragg elements is a layer of the same material as electrodes 114, 122, 152 and 164, e.g., molybdenum, which has an acoustic impedance of about 63 Mrayl. Using the same material for the high acoustic impedance Bragg elements and the electrodes of FBARs 110, 120, 150 and 160 allows the high acoustic impedance Bragg elements additionally to serve as the electrodes of the FBARs adjacent the acoustic coupling elements.

DSBAR 106 and DSBAR 108 are located adjacent one another suspended over cavity 104 defined in a substrate 102. Suspending the DSBARs over a cavity allows the stacked FBARs in each DSBAR to resonate mechanically. Other suspension schemes that allow the stacked FBARs to resonate mechanically are possible. For example, the DSBARs can be acoustically isolated from substrate 102 by an acoustic Bragg reflector (not shown), as described by John D. Larson III et al. in U. S. patent application Ser. No. 10/969,744 entitled Cavity-Less Film Bulk Acoustic Resonator (FBAR) Devices assigned to the assignee of this disclosure and incorporated by reference.

Referring additionally to FIG. 6, in the example shown in FIGS. 8A–8C, input terminals 132 and 134 are embodied as terminal pads 132 and 134 located on the major surface of substrate 102. Conductor 136 is embodied as an electrical trace extending from terminal pad 132 to electrode 112 of FBAR 110 and conductor 138 is embodied as an electrical trace extending from terminal pad 134 to electrode 114 of FBAR 110. Trace 136 extends over the major surface of substrate 102 and under part of piezoelectric layer 118 and conductor 138 extends over the major surface of substrate 102 and over part of piezoelectric layer 118. Output terminals 172 and 174 are embodied as terminal pads 172 and 174 located on the major surface of substrate 102. Conductor 176 is embodied as an electrical trace extending from terminal pad 172 to electrode 162 of FBAR 160 and conductor 178 is embodied as an electrical trace extending from terminal pad 174 to electrode 164 of FBAR 160. Trace 176 extends over the major surface of substrate 102 and under piezoelectric layer 118 and trace 178 extends over the major surface of substrate 102 and over piezoelectric layer 118. Conductor 182 is embodied as an electrical trace 182 that extends over the major surface of acoustic decoupling layer 131 from electrode 122 of FBAR 120 to electrode 152 of FBAR 150. Conductor 184 is embodied as an electrical trace 184 that extends over the major surface of piezoelectric layer 128 from the electrode 124 of FBAR 120 to the electrode 154 of FBAR 150.

Thousands of band-pass filters similar to band-pass filter 100 are fabricated at a time by wafer-scale fabrication. Such wafer-scale fabrication makes the band-pass filters inexpensive to fabricate. An exemplary fabrication process that, simplified and with different masks, can be used to fabricate embodiments of band-pass filter 100 will be described below.

Figure 9A:
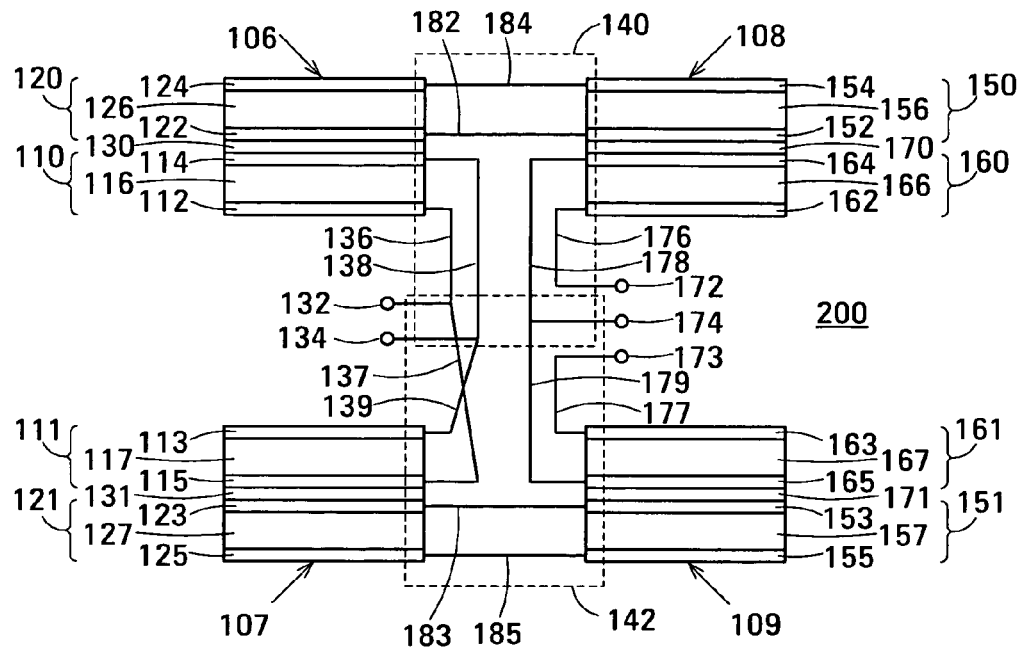
FIGS. 9A–9D are schematic drawings of four versions of a second embodiment of a DSBAR-based band-pass filter in accordance with the invention.

FIGS. 9A–9D are schematic drawings of four variations of a second embodiment 200 of a band-pass filter in accordance with the invention. Referring first to FIG. 9A, band-pass filter 200 has first terminals 132 and 134 and second terminals 172, 173 and, optionally, center-tap second terminal 174. Band-pass filter 200 has a 1:4 ratio between the impedance between first terminals 132, 134 and the impedance between second terminals 172, 173.

Band-pass filter 200 is composed of a first decoupled stacked bulk acoustic resonator (DSBAR) 106, a second DSBAR 108, a third DSBAR 107 and a fourth DSBAR 109. Each DSBAR comprises a first film bulk acoustic resonator (FBAR), a second FBAR and an acoustic decoupler between the FBARs. Each FBAR has opposed planar electrodes and a piezoelectric element between the electrodes. Band-pass filter 200 additionally has a first electrical circuit 140 that connects first DSBAR 106 and second DSBAR 108 in series between first terminals 132 and 134 and second terminals 172–174; and a second electrical circuit 142 that connects third DSBAR 107 and fourth DSBAR 109 in series between first terminals 132 and 134 and second terminals 172–174. One of first electrical circuit 140 and second electrical circuit 142 is phase-inverting relative to the other.

Band-pass filter 200 will now be described in further detail with reference to the example shown in FIG. 9A in which first terminals 132 and 134 are designated as input terminals, and second terminals 172, 173 and, optionally, 174 are designated as output terminals. Alternatively, first terminals 132 and 134 may be designated as output terminals, in which case, second terminals 172, 173 and, optionally, 174 are designated as input terminals.

In band-pass filter 200, first DSBAR 106 and second DSBAR 108 and their constituent FBARs 110, 120, 150 and 160 are structured as described above with reference to FIG. 6 and will therefore not be described again here. Third DSBAR 107 is composed of a first FBAR 111, a second FBAR 121 and an acoustic decoupler 131 between the FBARs. Fourth DSBAR 109 is composed of a first FBAR 151, a second FBAR 161 and an acoustic decoupler 171 between the FBARs. In the example shown, second FBAR 121 is stacked on first FBAR 111 and first FBAR 151 is stacked on second FBAR 161. Alternatively, first FBAR 111 may be stacked on second FBAR 121 and second FBAR 161 may be stacked on first FBAR 151.

In third DSBAR 107, first FBAR 111 is composed of opposed planar electrodes 113 and 115 and piezoelectric element 117 between electrodes 113 and 115, and second FBAR 121 is composed of opposed planar electrodes 123 and 125 and piezoelectric element 127 between electrodes 123 and 125. In fourth DSBAR 109, first FBAR 151 is composed of opposed planar electrodes 153 and 155 and piezoelectric element 157 between electrodes 153 and 155, and second FBAR 161 is composed of opposed planar electrodes 163 and 165 and piezoelectric element 167 between electrodes 163 and 165.

Electrical circuit 140 is composed of conductors 136, 138, 176, 178, 182 and 184. Conductors 136 and 138 respectively electrically connect first terminals 132 and 134 to the electrodes 112 and 114, respectively, of the first FBAR 110 of first DSBAR 106. Conductors 182 and 184 connect DSBARs 106 and 108 in series by respectively connecting the electrode 122 of second FBAR 120 to the electrode 152 of first FBAR 150 and connecting the electrode 124 of second FBAR 120 to the electrode 154 of first FBAR 150. Conductors 176 and 178 respectively electrically connect the electrodes 162 and 164, respectively, of the second FBAR 160 of second DSBAR 108 to output terminals 172 and 174. Configured as just described, electrical circuit 140 is non-inverting between input terminals 132, 134 and output terminals 172, 174.

Electrical circuit 142 is composed of conductors 137, 139, 177, 179, 183 and 185. Conductors 137 and 139 respectively electrically connect first terminals 132 and 134 to the electrodes 115 and 113, respectively, of the first FBAR 111 of third DSBAR 107. Conductors 183 and 185 connect DSBARs 107 and 109 in series by respectively connecting the electrode 123 of second FBAR 121 to the electrode 153 of first FBAR 151 and connecting the electrode 125 of second FBAR 121 to the electrode 155 of first FBAR 151. Conductors 177 and 179 respectively electrically connect the electrodes 163 and 165, respectively, of the second FBAR 161 of fourth DSBAR 109 to output terminals 173 and 174. Configured as just described, electrical circuit 142 is phase-inverting between input terminals 132, 134 and output terminals 173, 174.

In the example shown in FIG. 9A, electrical circuits 140 and 142 connect input terminal 132 to electrodes 112 and 115 on opposite sides of the piezoelectric elements 116 and 117 of FBARs 110 and 111, respectively, and connect input terminal 134 to electrodes 114 and 113 on opposite sides of piezoelectric elements 116 and 117. This makes electrical circuits 140 and 142 phase-inverting relative to one another. In electrical circuit 142, the electrical connections between input terminals 132, 134 and electrodes 115, 113, respectively, constitute a phase-inverting connection.

Electrical circuits 140 and 142 apply the input electrical signal to FBARs 110 and 111 in anti-phase. This causes FBARs 110 and 111 to vibrate in anti-phase. Consequently, FBAR 120 and FBAR 121 vibrate in antiphase; and the electrical signal generated by FBAR 120 and applied to FBAR 150 and the electrical signal generated by FBAR 121 and applied to FBAR 151 are in antiphase. As a further consequence, FBAR 150 and FBAR 151 vibrate in antiphase and FBAR 160 and FBAR 161 vibrates in antiphase. The electrical signal between the electrodes 162 and 164 of FBAR 160 and the electrical signal between the electrodes 163 and 165 of FBAR 161 are therefore in antiphase. Electrical circuits 140 and 142 connect electrodes 162 and 163 on the same side of the piezoelectric elements 166 and 167, respectively, of FBARs 160 and 161 to output terminals 172 and 173, respectively, and connect electrodes 164 and 165 on the same side of piezoelectric elements 166 and 167, respectively, to one another and to center-tap output terminal 174. Accordingly, the output electrical signal between output terminal 172 and center-tap output terminal 174 and the output electrical signal between output terminal 173 and center-tap output terminal 174 are in antiphase.

The amplitude of the output signal between output terminals 172 and 173 is twice that of the input signal applied between input terminals 132 and 134. The impedance between output terminals 172 and 173 is equal to the impedances of FBARs 160 and 161 in series, whereas the impedance between input terminals 132 and 134 is equal to the impedances of FBARs 110 and 111 in parallel. In a typical embodiment in which FBARs 110, 111, 160 and 161 are all equal in impedance, the impedance between output terminals 172 and 173 is four times that between input terminals 132 and 134.

Figure 9B:
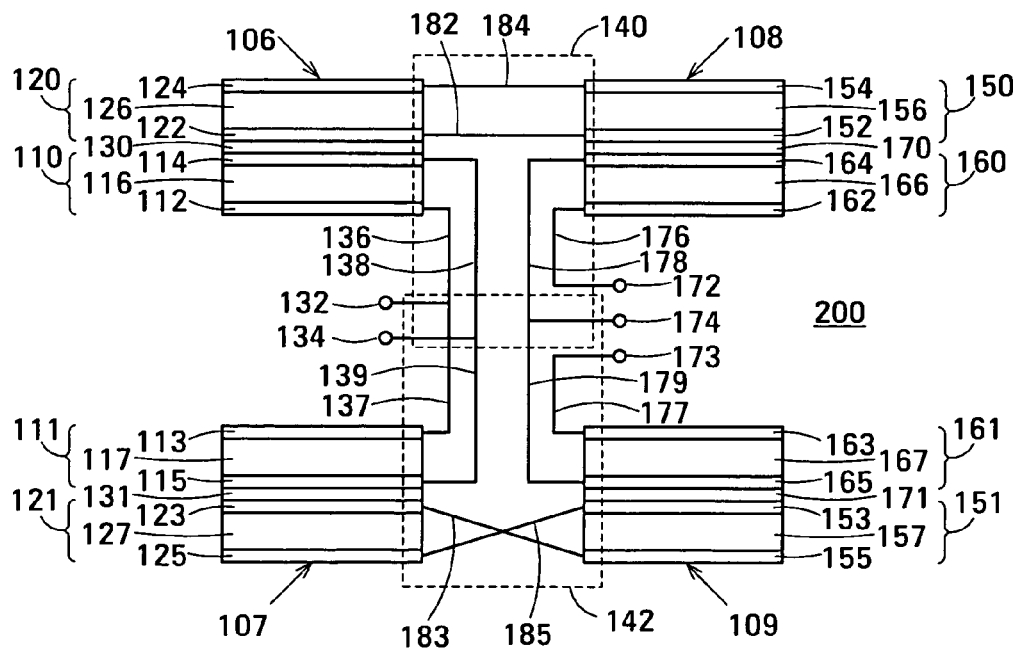

FIG. 9B shows another configuration of electrical circuit 142 that makes electrical circuit 142 phase-inverting relative to electrical circuit 140. In the example shown, electrical circuit 140 is configured as described above with reference to FIG. 9A and is therefore non-inverting between input terminals 132, 134 and output terminals 172, 174. Electrical circuit 142 connects input terminals 132 and 134 to the electrodes of 113 and 115, respectively, of FBAR 111. Additionally, in electrical circuit 142, conductor 183 connects the electrode 123 of FBAR 121 to the electrode 155 of FBAR 151 and conductor 185 connects the electrode 125 of FBAR 121 to the electrode 153 of FBAR 151. Finally, electrical circuit 142 connects the electrodes 163 and 165 of FBAR 161 to output terminals 173 and 174, respectively. Thus, electrical circuit 142 is phase-inverting between input terminals 132, 134 and output terminals 173, 174.

In the embodiment shown in FIG. 9B, the FBAR 110 of first DSBAR 106 and the FBAR 111 of third DSBAR 107 vibrate in phase in response to the input electrical signal, as do FBAR 120 and FBAR 121. However, the phase-inverting connection provided by conductors 183 and 185 causes the FBAR 150 of second DSBAR 108 and the FBAR 151 of fourth DSBAR 109 to vibrate in anti-phase, and causes FBAR 160 and FBAR 161 to vibrate in anti-phase. As a result, the electrical signal between the electrodes 162, 164 of FBAR 160 and the electrical signal between the corresponding electrodes 163, 165 of FBAR 161 are in antiphase. The electrical connections provided by conductors 176 and 178 between the electrodes 162, 164 of FBAR 160 and output terminals 172, 174 and those provided by conductors 177 and 179 between the corresponding electrodes 163, 165 of FBAR 161 and output terminals 173, 174 are not phase inverting. Consequently, the output electrical signal between output terminal 172 and center-tap output terminal 174 and the output electrical signal between output terminal 173 and center-tap output terminal 174 are in antiphase.

Figure 9C:
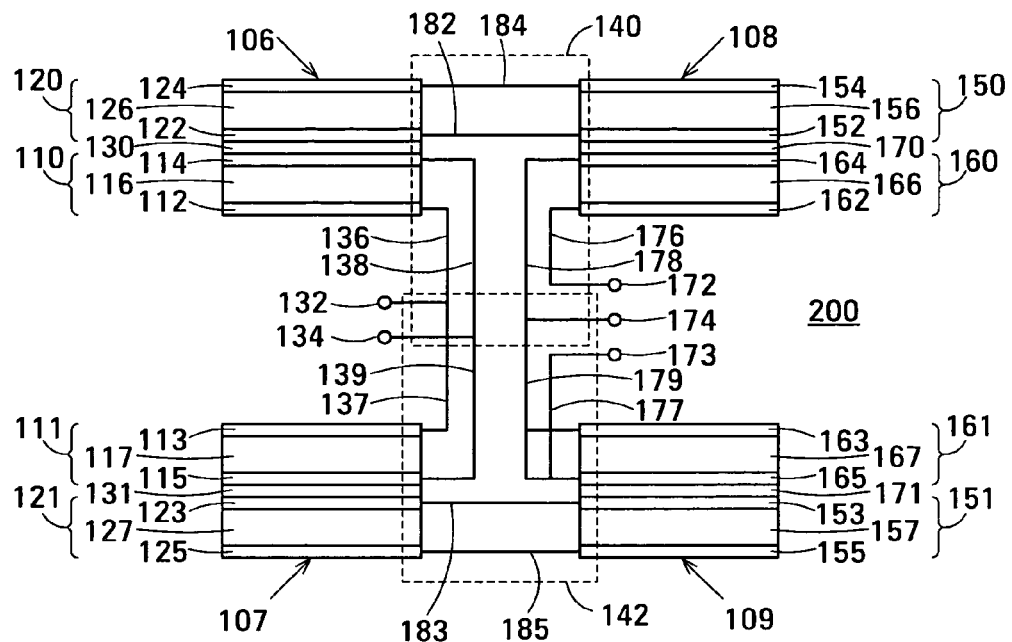

FIG. 9C shows another configuration of electrical circuit 142 that makes electrical circuit 142 phase-inverting relative to electrical circuit 140. In the example shown, electrical circuit 140 is configured as described above with reference to FIG. 9A and is therefore non-inverting between input terminals 132, 134 and output terminals 172, 174, respectively. Electrical circuit 142 connects input terminals 132 and 134 to the electrodes of 113 and 115, respectively, of FBAR 111. Additionally, in electrical circuit 142, conductor 183 connects the electrode 123 of FBAR 121 to the electrode 153 of FBAR 151 and conductor 185 connects the electrode 125 of FBAR 121 to the electrode 155 of FBAR 151. Finally, in electrical circuit 142, conductors 177 and 179 provide a phase-inverting connection in which they connect the electrodes 165 and 163, respectively, of FBAR 161 to output terminals 173 and 174, respectively. Electrical circuit 142 is therefore inverting between input terminals 132, 134 and output terminals 173, 174, respectively.

In the embodiment shown in FIG. 9C, the electrical circuits 140 and 142 apply the input electrical signal to FBARs 110 and 111 in phase. This causes FBARs 110 and 111 to vibrate in phase. Consequently, FBAR 120 and FBAR 121 vibrate in phase and the electrical signal generated by FBAR 120 and applied to FBAR 150 and the electrical signal generated by FBAR 121 and applied to FBAR 151 are in phase. As a further consequence, FBAR 150 and FBAR 151 vibrate in phase, and FBAR 160 and FBAR 161 vibrate in phase. The electrical signal between the electrodes 162, 164 of FBAR 160 and the electrical signal between the electrodes 163, 165 of FBAR 161 are therefore in phase. However, conductors 176, 178 connect the electrodes 162, 164 of FBAR 160 to output terminals 172, 174, respectively, whereas conductors 177, 179 connect the electrodes 165, 163 of FBAR 161 to output terminals 173, 174, respectively. This introduces a phase inversion, so that the output electrical signal between output terminal 172 and center-tap output terminal 174 and the output electrical signal between output terminal 173 and center-tap output terminal 174 are in antiphase.

Figure 9D:
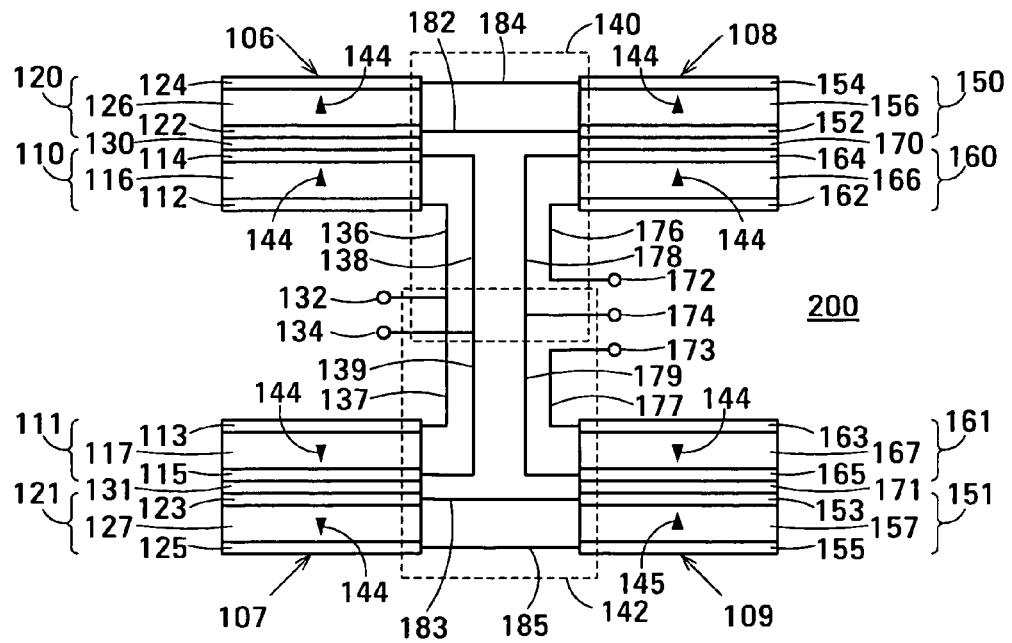

FIG. 9D shows yet another configuration of electrical circuit 142 that makes electrical circuit 142 phase-inverting relative to electrical circuit 140. This configuration avoids the need to make electrical connections between electrodes on opposite sides of any of the piezoelectric elements. In the example shown, the c-axes of piezoelectric elements 116, 126, 156 and 166 are oriented in the same direction 144, and electrical circuit 140 is configured as described above with reference to FIG. 9A. Electrical circuit 140 is therefore non-inverting between input terminals 132, 134 and output terminals 172, 174, respectively. Electrical circuit 142 is configured to connect input terminals 132, 134 to electrodes of 113, 115, respectively, of FBAR 111. Additionally, the direction 145 of the c-axis of piezoelectric element 157 of FBAR 151 is aligned opposite to the directions 144 of the c-axes of piezoelectric elements 117, 127 and 167. In electrical circuit 142, conductor 183 connects electrode 123 of FBAR 121 to electrode 153 of FBAR 151 and conductor 185 connects electrode 125 of FBAR 121 to electrode 155 of FBAR 151. The non-inverting electrical connection between FBARs 121 and 151 together with the reverse c-axis direction 145 of the piezoelectric element 157 of FBAR 151 collectively provide a phase-inverting connection. Finally, in electrical circuit 142, conductors 177, 179 connect the electrodes 163, 165 of FBAR 161 to output terminals 173 and 174, respectively. Thus, electrical circuit 142 is inverting between input terminals 132, 134 and output terminals 173, 174, respectively.

In the embodiment shown in FIG. 9D, the electrical circuits 140 and 142 apply the input electrical signal to FBARs 110 and 111 in phase. This causes FBARs 110 and 111 to vibrate in phase. Consequently, FBAR 120 and FBAR 121 vibrate in phase and the electrical signal generated by FBAR 120 and applied to FBAR 150 and the electrical signal generated by FBAR 121 and applied to FBAR 151 are in phase. The difference in the directions 144, 145 of the c-axes of the piezoelectric elements 156, 157, respectively, of FBAR 150 and FBAR 151 introduces a phase inversion. Consequently, FBAR 150 and FBAR 151 vibrate in antiphase despite in-phase electrical signals being applied to them. Additionally, FBAR 160 and FBAR 161 vibrate in antiphase so that the electrical signal between the electrodes 162 and 164 of FBAR 160 and the electrical signal between the electrodes 163 and 165, respectively, of FBAR 161 are in antiphase. Conductors 176 and 178 provide non-inverting electrical connections between the electrodes 162 and 164 of FBAR 160 and output terminals 172 and 174, respectively, and conductors 177 and 179 provide non-inverting electrical connections between the electrodes 163 and 165 of FBAR 161 and output terminals 173 and 174, respectively. Consequently, the output electrical signal between output terminal 172 and center-tap output terminal 174 and the output electrical signal between output terminal 173 and center-tap output terminal 174 are in antiphase.

In the example shown in FIG. 9D, the reverse c-axis material of the piezoelectric element 167 of the FBAR 161 of DSBAR 109 provides electrical circuit 142 with a phase-inverting connection. Additionally, in the example shown in FIG. 9D, only one of the piezoelectric elements 116, 117, 126, 127, 156, 157, 166 and 167 has a reverse c-axis. In other examples, any of the piezoelectric elements may have reverse c-axes as long as electrical circuit 140 or electrical circuit 142, but not both, is phase inverting. In embodiments in which the connections between input terminal 132 and electrodes 112 and 113, between input terminal 134 and electrodes 113 and 115, between electrodes 122 and 152, 123 and 153, 124 and 154, and 125 and 155, between electrode 162 and output terminal 172, between electrode 163 and output terminal 163, and between electrodes 164, 165 and output terminal 174 are the same as shown in FIG. 9D, one but not both of electrical circuits 140 and 142 is phase-inverting when the number of the piezoelectric elements of DSBARs 106 and 108 with reverse c-axes and the number of the piezoelectric elements of DSBARs 107 and 109 with reverse c-axes differ by an odd number.

In the examples shown in FIGS. 9A–9D, electrical circuit 142 can include more than one phase-inverting connection similar to those described above with reference to FIGS. 9A–9D as long as one of the electrical circuits 140 and 142 is phase-inverting relative to the other. Additionally or alternatively, electrical circuit 140 can include one or more phase-inverting connections similar to the above-described phase-inverting connections of electrical circuit 142, again as long as one of the electrical circuits 140 and 142 is phase-inverting relative to the other. Embodiments with the minimum number of phase-inverting connections are typically simplest to fabricate.

Figure 10A:
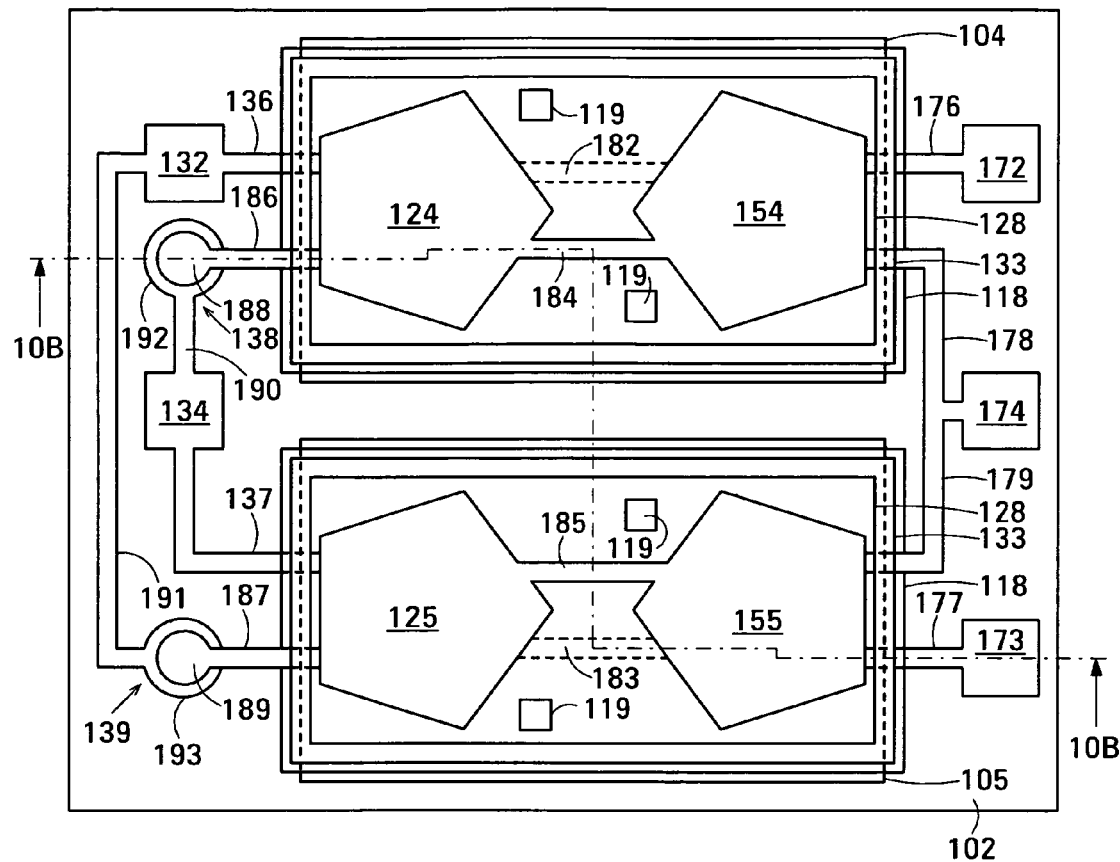
FIG. 10A is plan view of a practical example of the second embodiment of the band-pass filter in accordance with the invention shown in FIG. 9A.
Figure 10B:
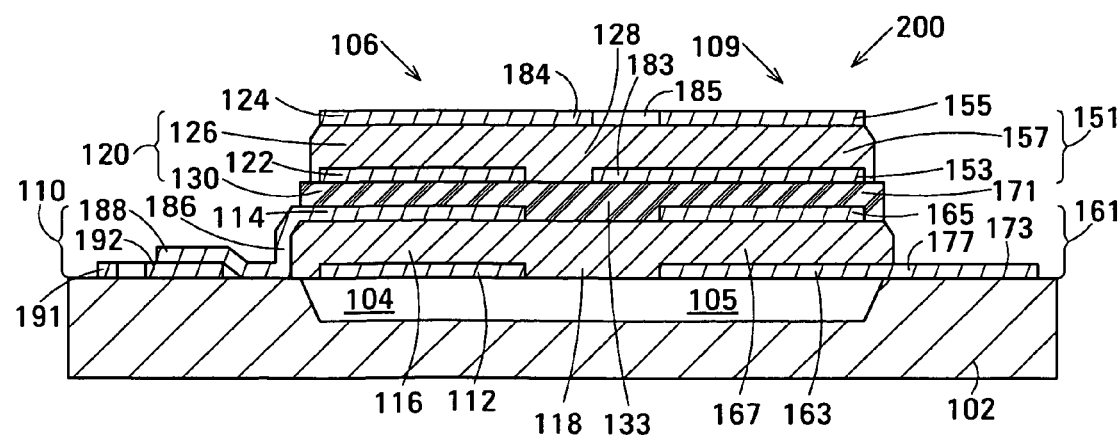
FIG. 10B is a cross-sectional view along the section line 10B—10B of the practical example of the embodiment shown in FIG. 10A of a band-pass filter in accordance with the invention.

FIGS. 10A and 10B are respectively a plan view and a cross-sectional view of a practical example of band-pass filter 200 in accordance with the invention. The example shown in FIGS. 10A and 10B is based on the embodiment shown in FIG. 9A. Elements of the example shown in FIGS. 10A and 10B that correspond to elements of the embodiment shown in FIGS. 6 and 9A are indicated using the same reference numerals and will not be described again in detail.

In band-pass filter 200, in DSBAR 106, acoustic decoupler 130 controls the coupling of acoustic energy between FBARs 110 and 120 as described above and, in DSBAR 108, acoustic decoupler 170 controls the coupling of acoustic energy between FBARs 150 and 160 as described above. Additionally, in DSBAR 107, acoustic decoupler 131 controls the coupling of acoustic energy between FBARs 111 and 121. Acoustic decoupler 131 couples less acoustic energy between FBARs 111 and 121 than would be coupled if the FBARs were in direct contact with one another. Additionally, in DSBAR 109, acoustic decoupler 171 controls the coupling of acoustic energy between FBARs 151 and 161. Acoustic decoupler 171 couples less acoustic energy between FBARs 151 and 161 than would be coupled if the FBARs were in direct contact with one another. The coupling of acoustic energy defined by acoustic decouplers 131 and 171 determines the pass bandwidths of DSBARs 107 and 109, respectively, and, hence, the pass bandwidth of band-pass filter 200.

In the example shown in FIGS. 10A–10B, acoustic decouplers 130, 131, 170 and 171 are respective parts of an acoustic decoupling layer 133. Acoustic decoupling layer 133 is a layer of acoustic decoupling material. Acoustic decoupling layer 133 is described above and will not be described again here. In another embodiment (not shown), acoustic decouplers 130, 131, 170 and 171 each include a Bragg structure composed of a low acoustic impedance Bragg element sandwiched between high acoustic impedance Bragg elements also as described above.

DSBAR 106 and DSBAR 108 are located adjacent one another suspended over cavity 104 defined in a substrate 102. DSBAR 107 and DSBAR 109 are located adjacent one another suspended over cavity 105 also defined in substrate 102. Alternatively, DSBARs 106–109 may be suspended over respective cavities (not shown) defined in substrate 102, or may all be suspended over a common cavity (not shown) defined in substrate 102. As another possibility, DSBAR 106 and DSBAR 107 are located adjacent one another suspended over common cavity defined in substrate 102 and DSBAR 108 and DSBAR 109 are located adjacent one another suspended over a common cavity also defined in the substrate. Suspending each DSBAR over a cavity allows the stacked FBARs in the DSBAR to resonate mechanically. Other suspension schemes that allow the stacked FBARs to resonate mechanically are possible. For example, DSBARs 106–109 can be acoustically isolated from substrate 102 by an acoustic Bragg reflector (not shown) as described above.

Referring additionally to FIG. 9A, in the example shown in FIGS. 10A–10B, input terminals 132 and 134 are embodied as terminal pads 132 and 134 located on the major surface of substrate 102. Connecting pads 192 and 193 are also located on the major surface of substrate 102. Connecting pad 188 is located on, and makes electrical contact with, connecting pad 192 and connecting pad 189 is located on, and makes electrical contact with, connecting pad 193.

Conductor 136 is embodied as an electrical trace 136 extending from terminal pad 132 to the electrode 112 of FBAR 110. Conductor 137 is embodied as an electrical trace 137 extending from terminal pad 134 to the electrode 113 of FBAR 111. Traces 136 and 137 extend over the major surface of substrate 102 and under piezoelectric layer 118. Conductor 138 is embodied as an electrical trace 190 extending over the major surface of substrate 102 from terminal pad 134 to connecting pad 192 and as an electrical trace 186 extending from the electrode 114 of FBAR 110 to connecting pad 188. Conductor 139 is embodied as an electrical trace 191 extending over the major surface of substrate 102 from terminal pad 132 to connecting pad 193 and an electrical trace 187 extending from the electrode 115 of FBAR 111 to connecting pad 189. Traces 186 and 187 extend over the major surface of substrate 102 and over piezoelectric layer 118.

Output terminals 172, 173 and 174 are embodied as terminal pads 172, 173 and 174 located on the major surface of substrate 102. Conductor 176 is embodied as an electrical trace 176 extending from terminal pad 172 to the electrode 162 of FBAR 160, conductor 177 is embodied as an electrical trace 177 extending from terminal pad 173 to the electrode 163 of FBAR 161, conductor 178 is embodied as an electrical trace 178 extending from terminal pad 174 to the electrode 164 of FBAR 160, and conductor 179 is embodied as an electrical trace 179 extending from terminal pad 174 to the electrode 165 of FBAR 161. Traces 176 and 177 extend over the major surface of substrate 102 and under piezoelectric layer 118. Traces 178 and 179 extend over the major surface of substrate 102 and over piezoelectric layer 118.

Conductor 182 is embodied as an electrical trace 182 that extends over the major surface of acoustic decoupling layer 131 from the electrode 122 of FBAR 120 to the electrode 152 of FBAR 150. Conductor 183 is embodied as an electrical trace 183 that extends over the major surface of acoustic decoupling layer 131 from the electrode 123 of FBAR 121 to the electrode 153 of FBAR 151. Conductor 184 is embodied as an electrical trace 184 that extends over the major surface of piezoelectric layer 128 from the electrode 124 of FBAR 120 to the electrode 154 of FBAR 150. Conductor 185 is embodied as an electrical trace 185 that extends over the major surface of piezoelectric layer 128 from the electrode 125 of FBAR 121 to the electrode 155 of FBAR 151.

Thousands of band-pass filters similar to band-pass filter 200 are fabricated at a time by wafer-scale fabrication. Such wafer-scale fabrication makes such band-pass filters inexpensive to fabricate.

An exemplary fabrication method will be described next with reference to the plan views of FIGS. 11A–11H and the cross-sectional views of FIGS. 11I–11P. As noted above, a simplified version of the fabrication method using different masks can be used to make embodiments of band-pass filter 100 described above with reference to FIGS. 6 and 8A–8C. The pass band of the embodiment of band-pass filter 200 whose fabrication will be described has a nominal center frequency of about 1.9 GHz. Embodiments for operation at other frequencies are similar in structure and fabrication but have thicknesses and lateral dimensions different from those exemplified below.

A wafer of substrate material is provided. A portion of the wafer constitutes, for each band-pass filter being fabricated, a substrate corresponding to the substrate 102 of band-pass filter 200. FIGS. 11A–11H and FIGS. 11I–11P illustrate, and the following description describes, the fabrication of band-pass filter 200 in and on a portion of the wafer. As band-pass filter 200 is fabricated, the remaining band-pass filters on the wafer are also fabricated.

Figure 11A:
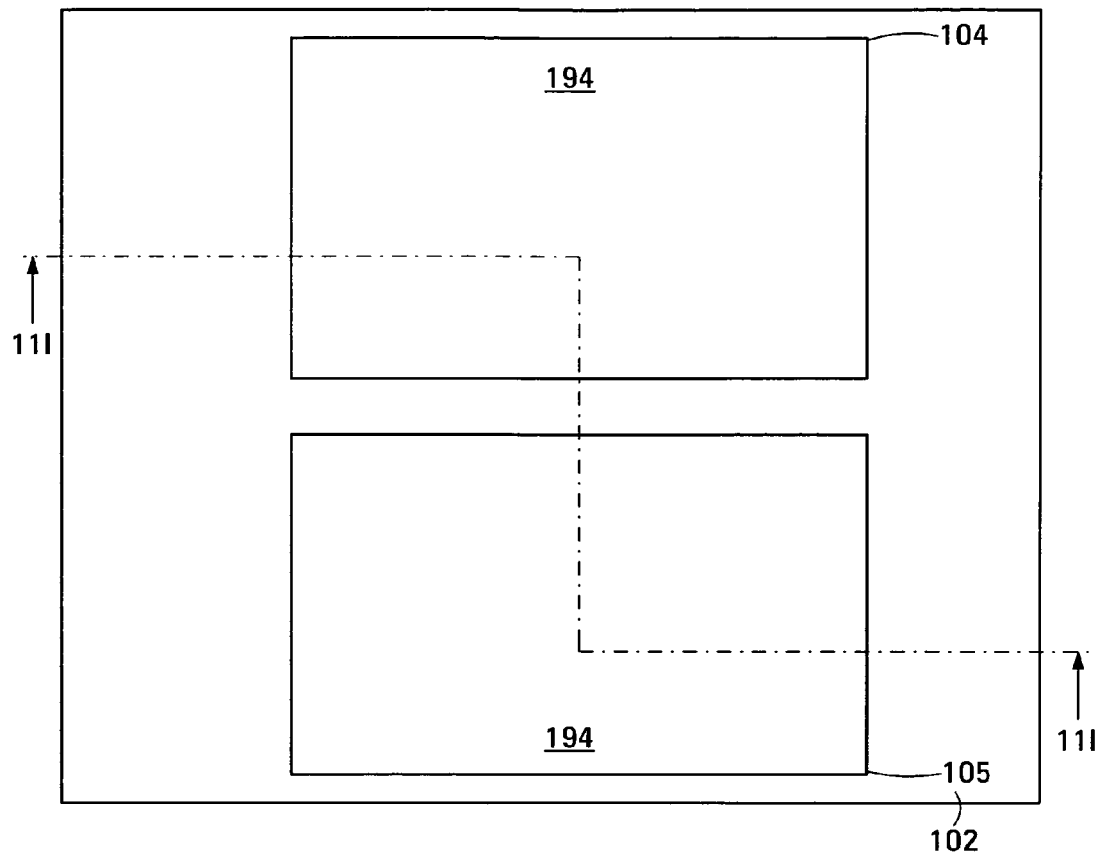
FIGS. 11A–11H are plan views illustrating a process for making the embodiment shown in FIG. 10A of a band-pass filter in accordance with the invention.
Figure 11I:
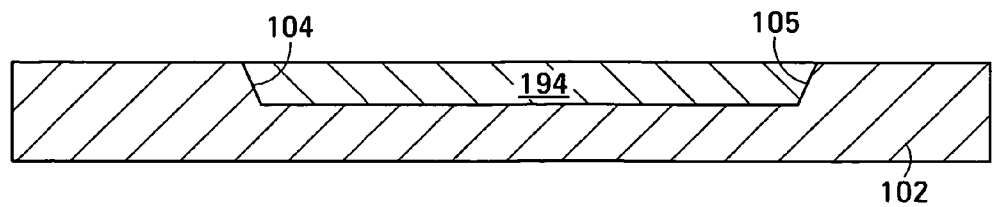
FIGS. 11I–11P are cross-sectional views along the section lines 11I—11I, 11J—11J, 11K—11K, 11L—11L, 11M—11M; 11N—11N, 11O—11O and 11P—11P in FIGS. 11A–11H, respectively.

A cavity 104 and a cavity 105 are formed as shown in FIGS. 11A and 11I in the portion of the wafer that constitutes the substrate 102 of band-pass filter 200. A layer (not shown) of fill material is deposited on the surface of the wafer with a thickness sufficient to fill the cavities. The surface of the wafer is then planarized to leave each cavity filled with the fill material. FIGS. 11A and 11I show cavity 104 and cavity 105 in substrate 102 filled with fill material 194.

In an exemplary embodiment, the wafer of which substrate 102 forms part was a wafer of single-crystal silicon, cavities 104 and 105 were formed by wet etching and fill material 194 was phosphosilicate glass (PSG) deposited using conventional low-pressure chemical vapor deposition (LPCVD). The fill material may alternatively be deposited by sputtering, or by spin coating.

Figure 11B:
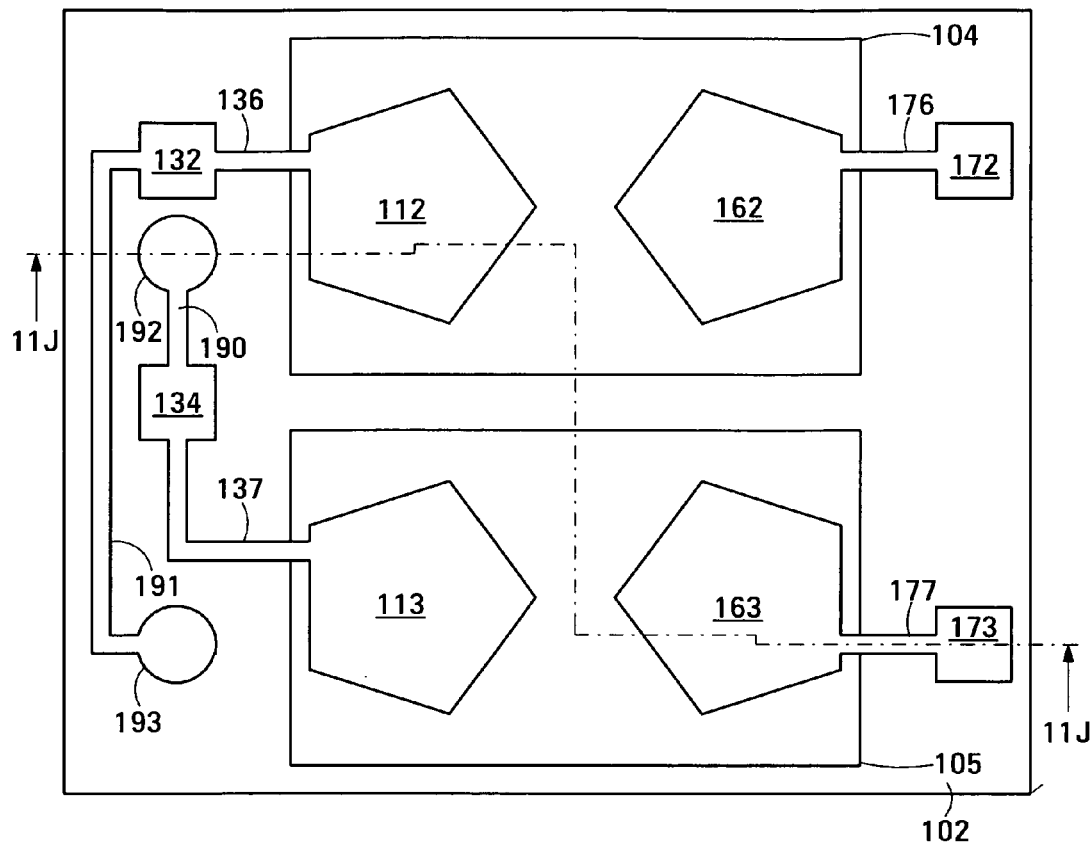
Figure 11J:
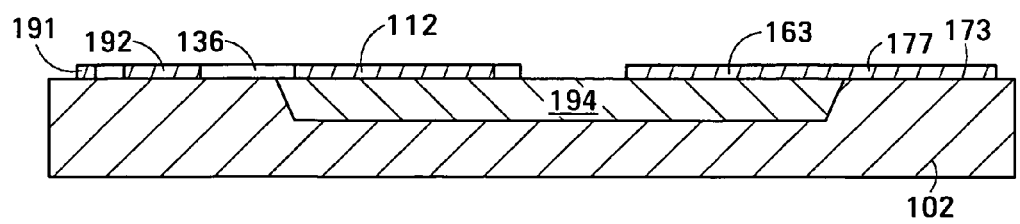

A first metal layer is deposited on the surface of the wafer and the fill material. The metal layer is patterned as shown in FIGS. 11B and 11J to define electrodes 112, 113, 162 and 163; terminal pads 132, 134, 172 and 173; connecting pads 192 and 193; electrical trace 136 extending between electrode 112 and terminal pad 132; electrical trace 137 extending between electrode 113 and terminal pad 134; electrical trace 176 extending between electrode 162 and terminal pad 172; electrical trace 177 extending between electrode 163 and terminal pad 173; electrical trace 190 extending between connecting pad 192 and terminal pad 134; and electrical trace 191 extending between connecting pad 193 and terminal pad 132.

Electrodes 112, 113, 162 and 163 typically have an asymmetrical shape in a plane parallel to the major surface of the wafer. An asymmetrical shape minimizes lateral modes in FBARs 110, 111, 160 and 161 (FIG. 9A) of which the electrodes form part, as described in U S. Pat. No. 6,215,375 of Larson III et al., incorporated by reference. Electrodes 112, 113, 162 and 163 are located to expose part of the surface of fill material 194 so that the fill material can later be removed by etching, as will be described below.

Referring additionally to FIG. 9A, electrodes 114, 115, 164 and 165 are defined in a second metal layer, electrodes 122, 123, 152 and 153 are defined in a third metal layer and electrodes 124, 125, 154 and 155 are defined in a fourth metal layer, as will be described in detail below. The first through fourth metal layers in which electrodes 112, 113, 114, 115, 122, 123, 124, 125, 152, 153, 154, 155, 162, 163, 164 and 165 are defined are patterned such that, in respective planes parallel to the major surface of the wafer, electrodes 112 and 114 of FBAR 110 have the same shape, size, orientation and position, electrodes 113 and 115 of FBAR 111 have the same shape, size, orientation and position, electrodes 122 and 124 of FBAR 120 have the same shape, size, orientation and position, electrodes 123 and 125 of FBAR 121 have the same shape, size, orientation and position, electrodes 152 and 154 of FBAR 150 have the same shape, size, orientation and position electrodes 153 and 155 of FBAR 151 have the same shape, size, orientation and position, electrodes 162 and 164 of FBAR 160 have the same shape, size, orientation and position and electrodes 163 and 165 of FBAR 161 have the same shape, size, orientation and position. Typically, electrodes 114 and 122 additionally have the same shape, size, orientation and position, electrodes 115 and 123 additionally have the same shape, size, orientation and position, electrodes 152 and 164 additionally have the same shape, size, orientation and position and electrodes 153 and 165 additionally have the same shape, size, orientation and position.

In an exemplary embodiment, the material of each of the first through fourth metal layers was molybdenum deposited by sputtering to a thickness of about 300 nm. The metal layers were each patterned by dry etching. The electrodes defined in each of the metal layers were pentagonal each with an area of about 12,000 square μm. Other electrode areas give other characteristic impedances. Other refractory metals such as tungsten, niobium and titanium may alternatively be used as the material of the metal layers. The metal layers may each alternatively comprise layers of more than one material.

One factor to be considered in choosing the material of the electrodes of band-pass filter 200 is the acoustic properties of the electrode material: the acoustic properties of the material(s) of the remaining metal parts of the band-pass filter are less important than other properties such as electrical conductivity. Thus, material(s) of the remaining metal parts of band-pass filter 200 other than the electrodes may be different from the material of the electrodes.

Figure 11C:
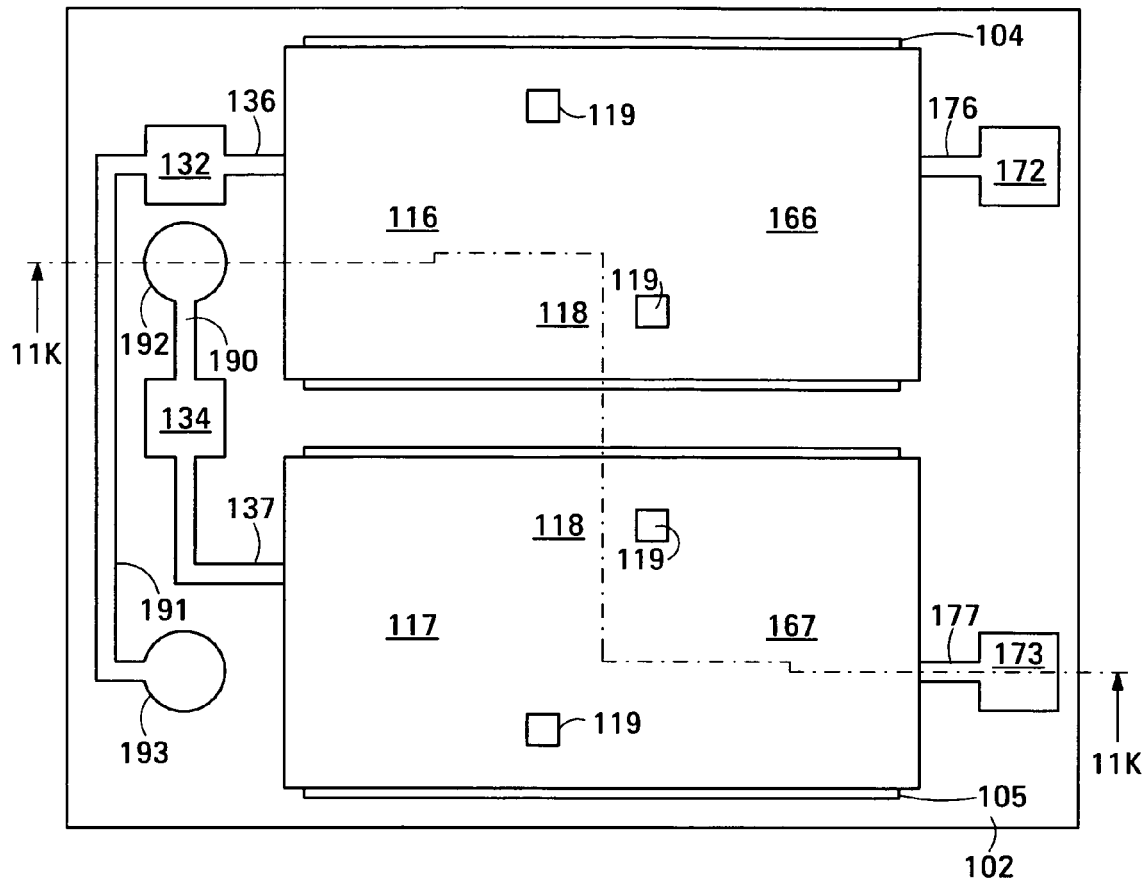
Figure 11K:
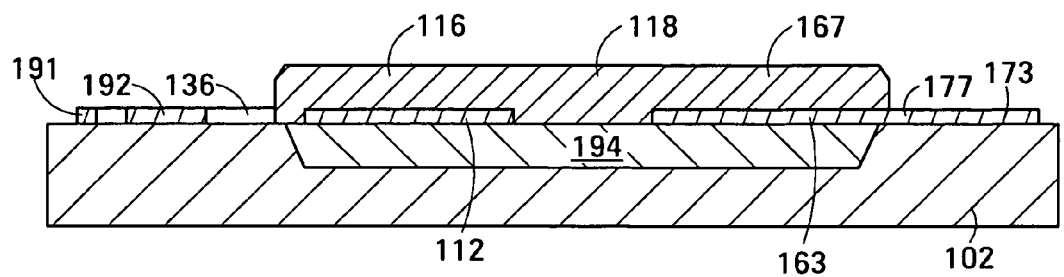

A layer of piezoelectric material is deposited and is patterned as shown in FIGS. 11C and 11K to define a piezoelectric layer 118 that provides piezoelectric element 116 of FBAR 110, piezoelectric element 117 of FBAR 111, piezoelectric element 166 of FBAR 160 and piezoelectric element 167 of FBAR 161. Piezoelectric layer 118 is patterned to expose part of the surface of fill material 194, terminal pads 132, 134, 172 and 173 and connecting pads 192 and 193. Piezoelectric layer 118 is additionally patterned to define windows 119 that provide access to additional parts of the surface of fill material 194.

In the exemplary embodiment, the piezoelectric material deposited to form piezoelectric layer 118 and piezoelectric layer 128 described below was aluminum nitride. The piezoelectric material was deposited with a thickness of about 1.4 μm by sputtering and was patterned by wet etching in potassium hydroxide or by chlorine-based dry etching. Alternative materials for piezoelectric layers 118 and 128 include zinc oxide, cadmium sulfide and poled ferroelectric materials such as perovskite ferroelectric materials, including lead zirconium titanate, lead meta niobate and barium titanate.

Figure 11D:
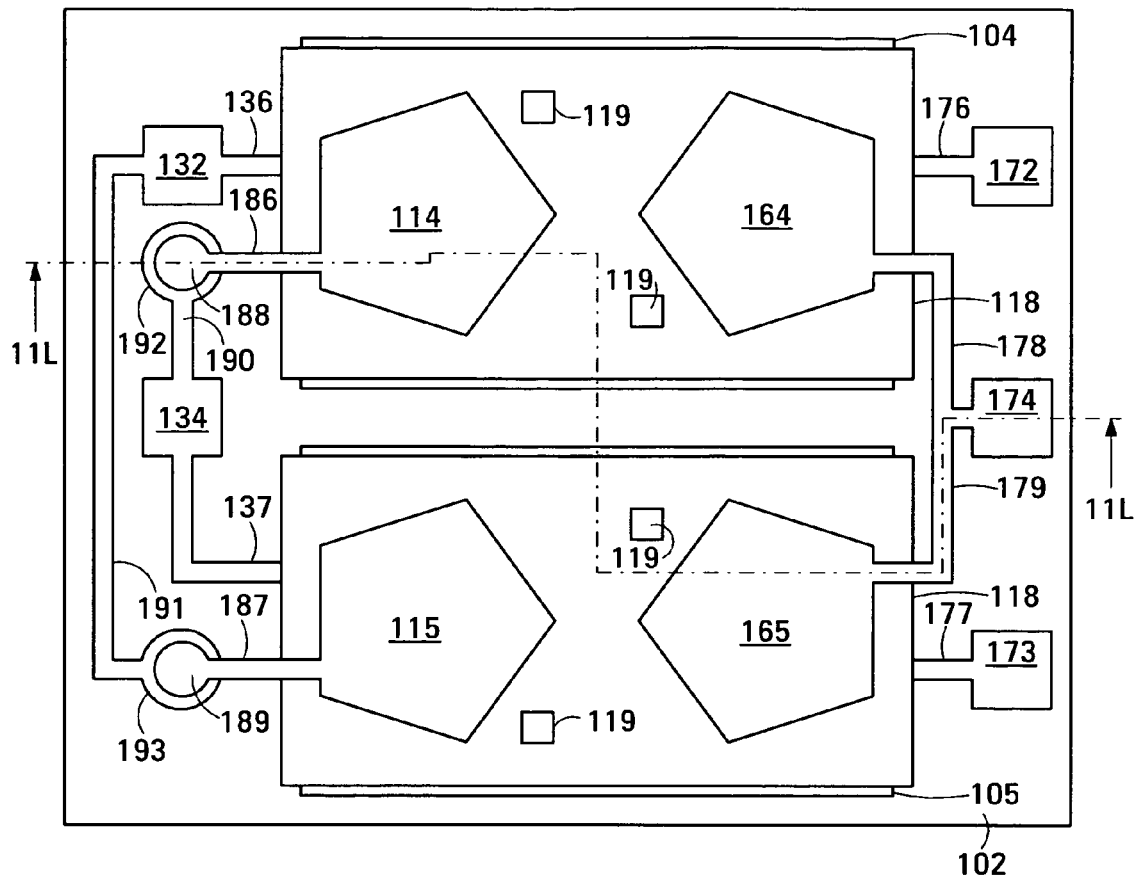
Figure 11L:
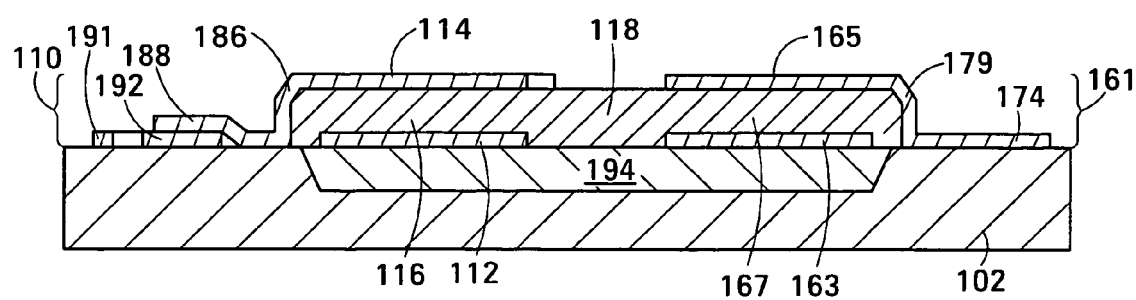

The second metal layer is deposited and is patterned as shown in FIGS. 11D and 11L to define electrodes 114, 115, 164 and 165; terminal pad 174; connecting pads 188 and 189; electrical trace 186 extending between electrode 114 and connecting pad 188; electrical trace 187 extending between electrode 115 and connecting pad 189; electrical trace 178 extending between electrode 164 and terminal pad 174; and electrical trace 179 extending between electrode 165 and terminal pad 174. Connecting pad 188 is located in electrical contact with connecting pad 192 to provide an electrical connections between electrodes 113 and 114 located on opposite sides of piezoelectric layer 118. Connecting pad 189 is located in electrical contact with connecting pad 193 to provide an electrical connection between electrodes 112 and 115 located on opposite sides of piezoelectric layer 118.

Figure 11E:
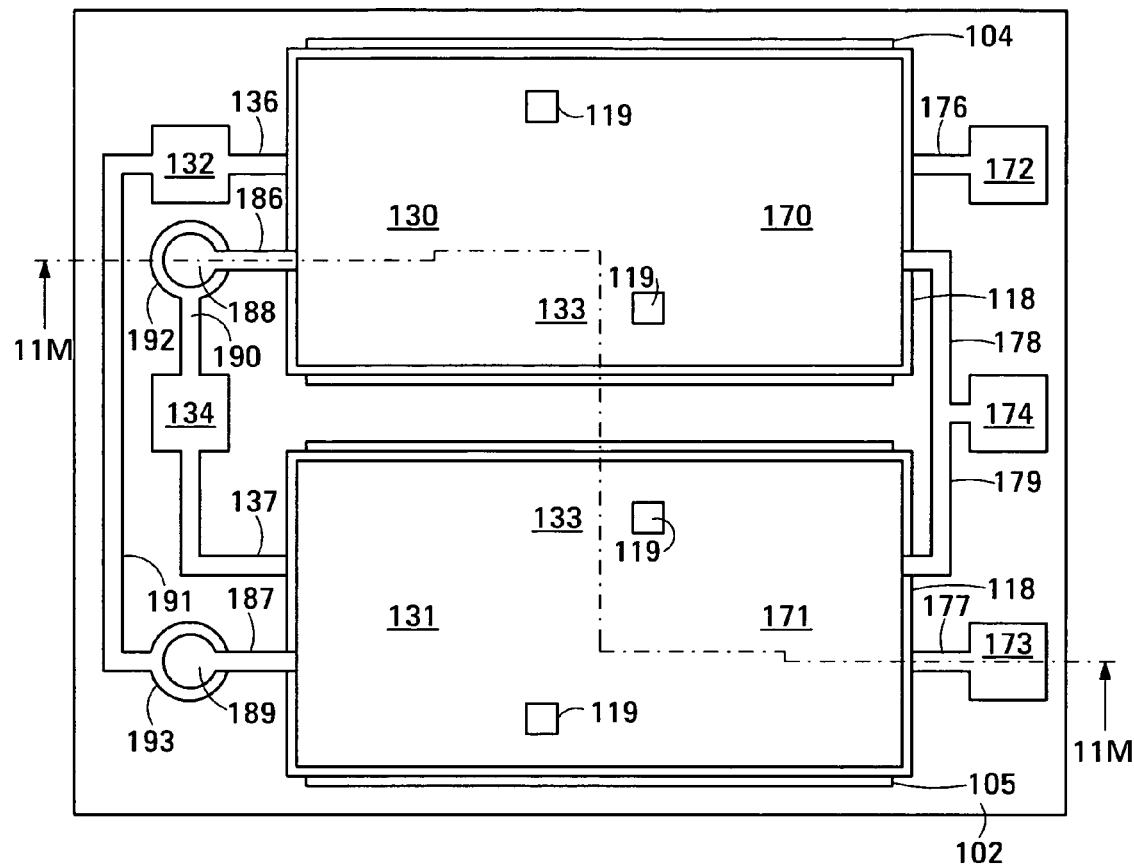
Figure 11M:
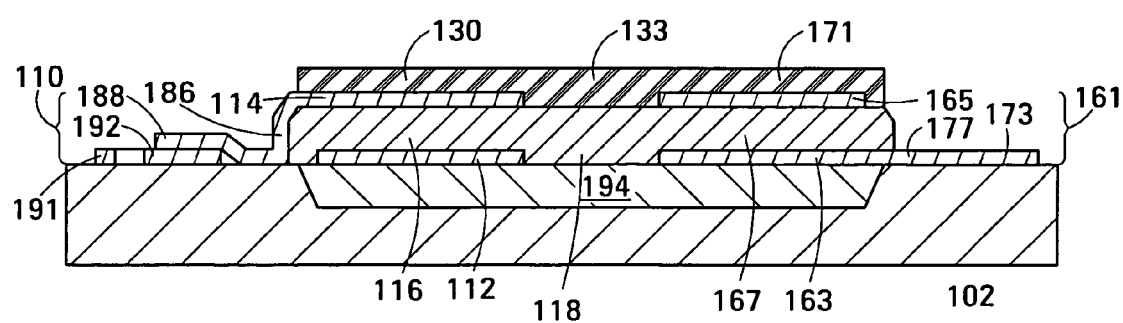

A layer of acoustic decoupling material is then deposited and is patterned as shown in FIGS. 11E and 11M to define acoustic decoupling layer 133 that provides acoustic decouplers 130, 131, 170, and 171. Acoustic decoupling layer 133 is shaped to cover at least electrodes 114, 115, 164 and 165, and is additionally shaped to expose part of the surface of fill material 194 and terminal pads 132, 134, 172 and 173. Acoustic decoupling layer 133 is additionally patterned to define windows 119 that provide access to additional parts of the surface of the fill material.

In the exemplary embodiment, the acoustic decoupling material was polyimide with a thickness of about 100 nm, i.e., one quarter of the center frequency wavelength in the polyimide. The polyimide was deposited to form acoustic decoupling layer 133 by spin coating, and was patterned by photolithography. Polyimide is photosensitive so that no photoresist is needed. As noted above, other plastic materials can be used as the acoustic decoupling material. The acoustic decoupling material can be deposited by methods other than spin coating.

After deposition and patterning of the polyimide acoustic decoupling layer 133, the wafer was first baked at a temperature of about 250° C. in air and was then baked at a temperature of about 415° C. in an inert atmosphere, such as a nitrogen atmosphere, before further processing was performed. The bake evaporates volatile constituents of the polyimide and prevents the evaporation of such volatile constituents during subsequent processing from causing separation of subsequently-deposited layers.

Figure 11F:
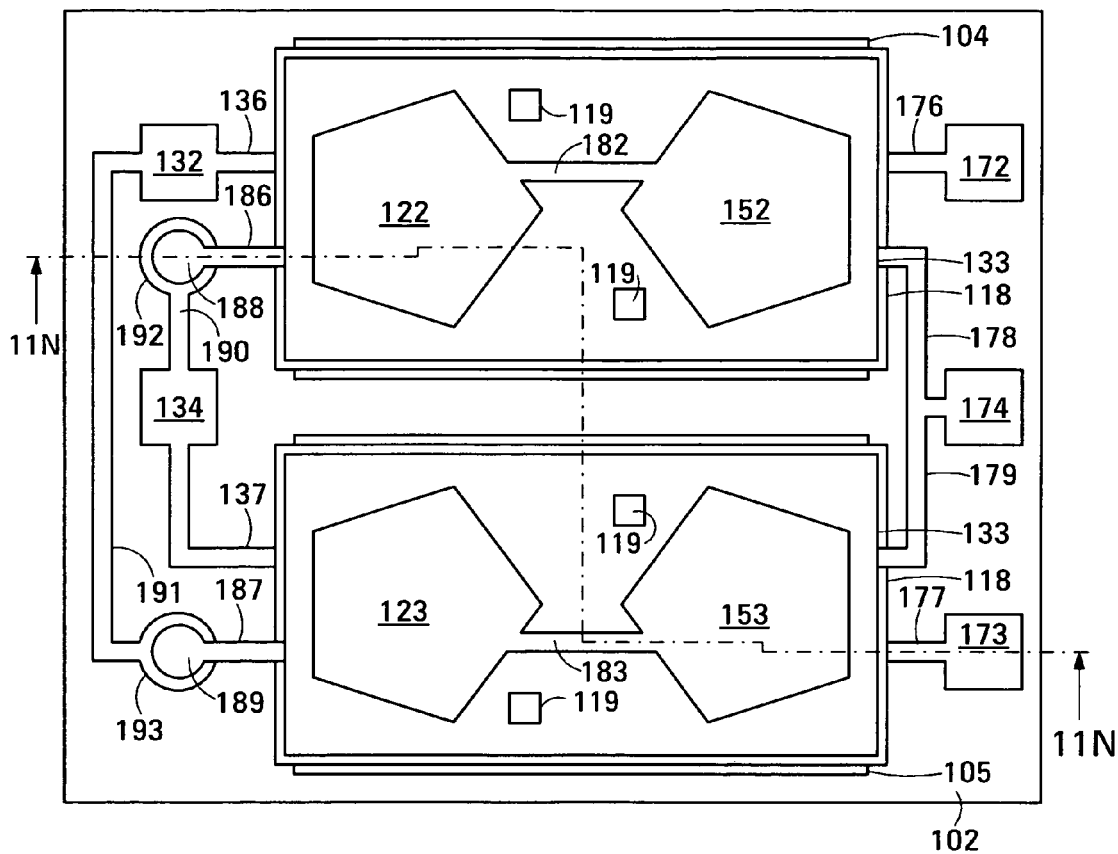
Figure 11N:
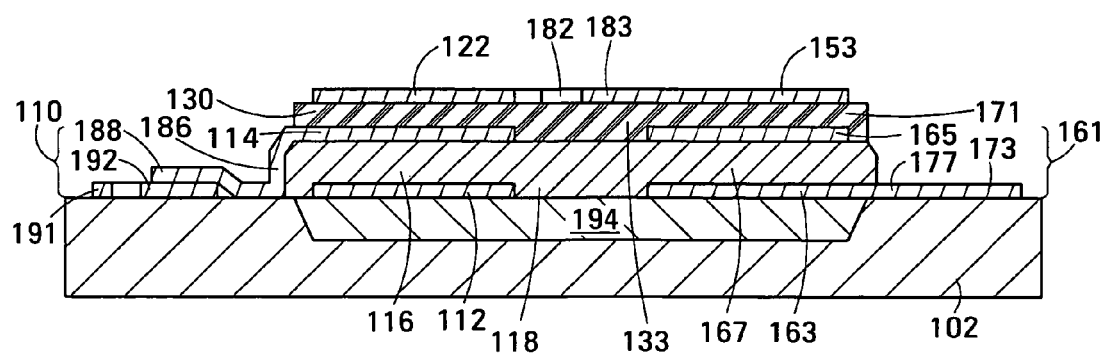

The third metal layer is deposited and is patterned as shown in FIGS. 11F and 11N to define electrodes 122, 123, 152 and 153; electrical trace 182 extending between electrode 122 and electrode 152; and electrical trace 183 extending between electrode 123 and electrode 153.

Figure 11G:
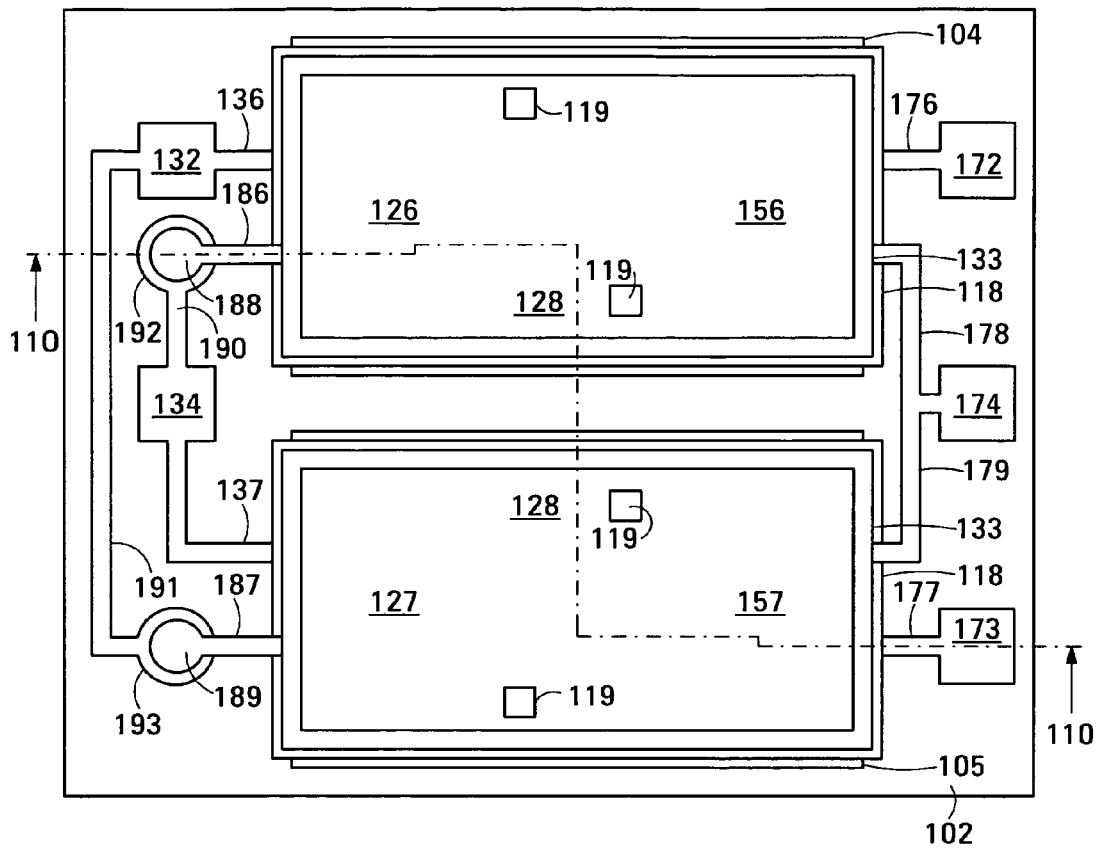
Figure 11O:
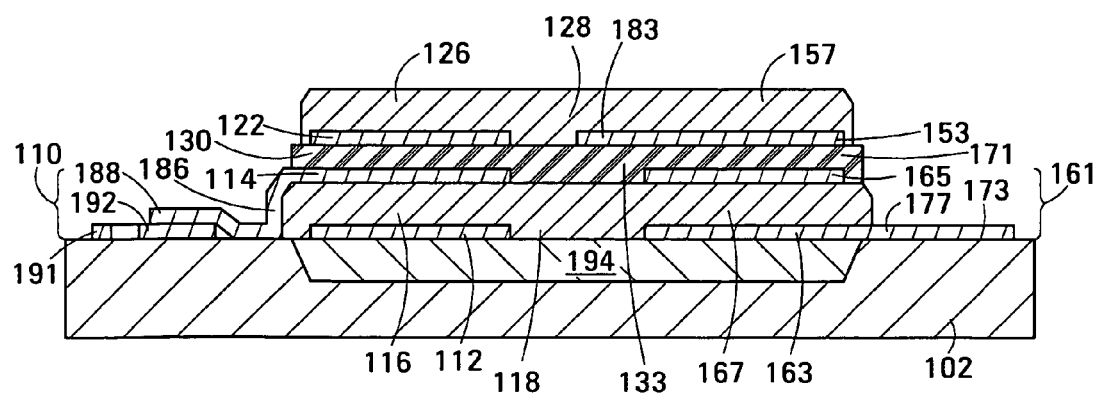

A layer of piezoelectric material is deposited and is patterned as shown in FIGS. 11G and 11O to define piezoelectric layer 128 that provides piezoelectric element 126 of FBAR 120, piezoelectric element 127 of FBAR 121, piezoelectric element 156 of FBAR 150 and piezoelectric element 157 of FBAR 151. Piezoelectric layer 128 is patterned to expose terminal pads 132, 134, 172, 173 and 174 and to expose part of the surface of fill material 194. Piezoelectric layer 128 is additionally patterned to define the windows 119 that provide access to additional parts of the surface of the fill material.

Figure 11H:
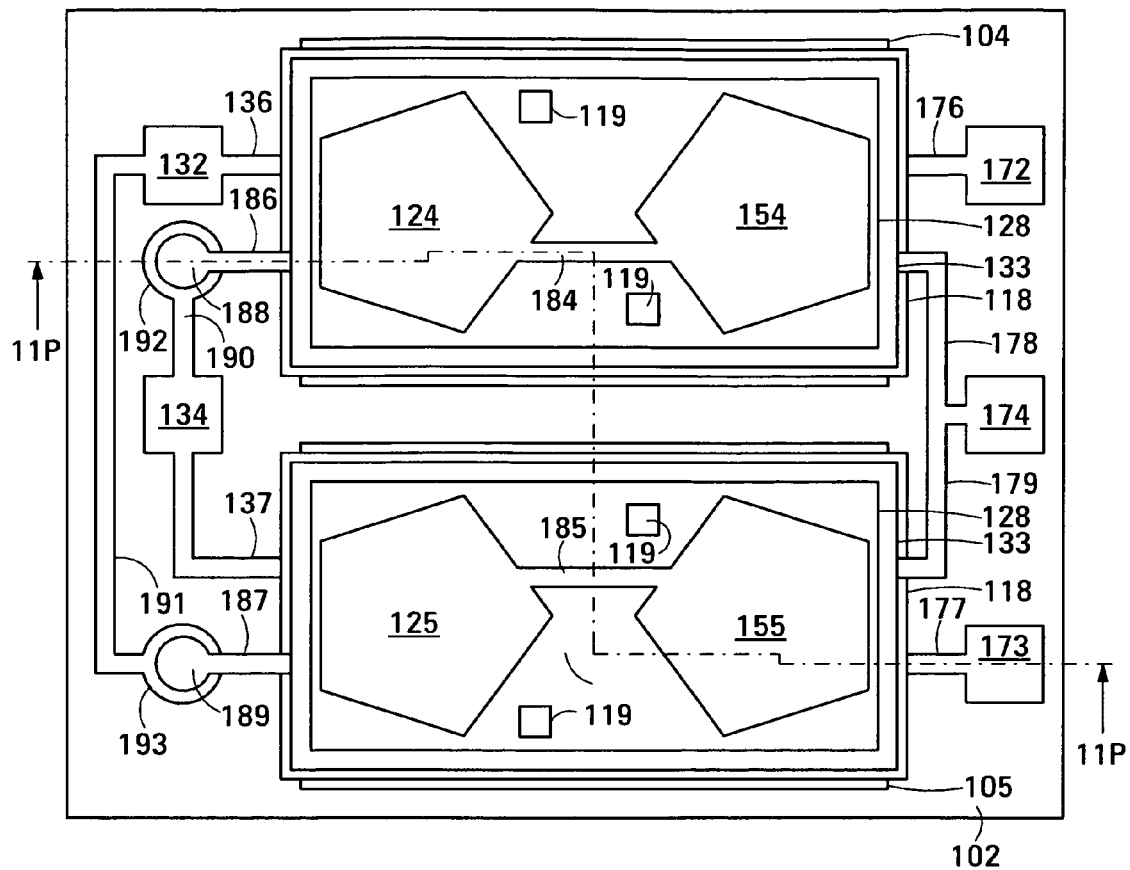
Figure 11P:
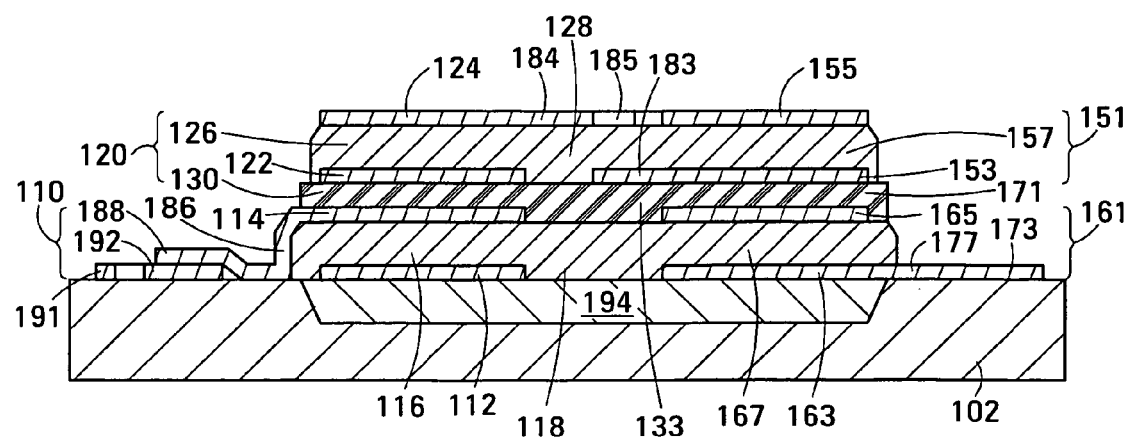

The fourth metal layer is deposited and is patterned as shown in FIGS. 11H and 11P to define electrodes 124, 125, 154 and 155; electrical trace 184 extending from electrode 124 to electrode 154; and electrical trace 185 extending from electrode 125 to electrode 155.

The wafer is then isotropically wet etched to remove fill material 194 from cavity 104 and from cavity 105. As noted above, portions of the surface of fill material 194 remain exposed through, for example, windows 119. The etch process leaves DSBARs 106 and 108 suspended over cavity 104, and DSBARs 107 and 109 suspended over cavity 105, as shown in part in FIG. 10B.

In the exemplary embodiment, the etchant used to remove fill material 194 from cavities 104 and 105 was dilute hydrofluoric acid.

A gold protective layer is deposited on the exposed surfaces of terminal pads 132, 134, 172, 173 and 174.

The wafer is then divided into individual band-pass filters, including band-pass filter 200. Each band-pass filter is then mounted in a package and electrical connections are made between terminal pads 132, 134, 172, 173 and 174 of the band-pass filter and pads that are part of the package.

A process similar to that described may be used to fabricate embodiments of band-pass filter 200 in which electrical circuits 140 and 142 are configured as shown in FIGS. 9B–9D. Processes for forming the piezoelectric material with a reverse c-axis used in the embodiment described above with reference to FIG. 9D are known in the art. Some suitable processes are described by Larson III et al. in U. S. patent application Ser. No. 10/836,653, incorporated herein by reference.

In use, terminal pad 132 electrically connected to electrodes 112 and 115 and terminal pad 134 electrically connected to electrodes 114 and 113 provide the first terminals of the band-pass filter 200; and terminal pad 172 electrically connected to electrode 162 and terminal pad 173 electrically connected to electrode 163 provide the second terminals of band-pass filter 200. Terminal pad 174 electrically connected to electrodes 164 and 165 optionally provides a center-tap second terminal of band-pass filter 200. In one embodiment, the first terminals constitute the input terminals and the second terminals constitute the output terminals of band-pass filter 200. In another embodiment, the first terminals constitute the output terminals and the second terminals constitute the input terminals of band-pass filter 200.

In another embodiment, the acoustic decoupling material of acoustic decoupling layer 133 is a crosslinked polyphenylene polymer. After the layer of metal has been patterned to define electrodes 114, 115, 164 and 165; terminal pad 174; connecting pads 188 and 189; and electrical traces 178, 179, 186 and 187, as described above with reference to FIGS. 11D and 11L, the precursor solution for the crosslinked polyphenylene polymer is spun on in a manner similar to that described above with reference to FIGS. 11E and 11M, but is not patterned. The formulation of the precursor solution and the spin speed are selected so that the crosslinked polyphenylene polymer forms a layer with a thickness of about 187 nm. This corresponds to about one quarter of the wavelength $\lambda_n$ in the crosslinked polyphenylene polymer of an acoustic signal having a frequency equal to the center frequency of the pass band of band-pass filter 200. The wafer is then baked at a temperature in the range from about 385° C. to about 450° C. in an inert ambient, such as under vacuum or in a nitrogen atmosphere, before further processing is performed. The bake first drives off the organic solvents from the precursor solution, and then causes the oligomer to cross link as described above to form the crosslinked polyphenylene polymer.

A layer of metal is then deposited on the layer of crosslinked polyphenylene polymer in a manner similar to that described above with reference to FIGS. 11F and 11N, but is initially patterned similarly to the patterning of acoustic decoupling layer 133 shown in FIG. 11E. This defines a hard mask that will later be used to pattern the layer of crosslinked polyphenylene polymer to define acoustic decoupling layer 133. The initially-patterned layer of metal has the same extent as acoustic decoupling layer 133, exposes terminal pads 132, 134, 172, 173 and 174 and parts of the surface of fill material 194, and has windows in the intended locations of windows 119 in acoustic decoupling layer 133.

The layer of crosslinked polyphenylene polymer is then patterned as shown in FIG. 11E with the initially-patterned layer of metal as a hard etch mask. Patterning the layer of crosslinked polyphenylene polymer defines the extent of acoustic decoupling layer 133, which exposes terminal pads 132, 134, 172, 173 and 174 and parts of the surface of fill material 194, and forms windows 119 that provide access to additional parts of the surface of the fill material. The patterning is performed with an oxygen plasma etch.

The layer of metal is then re-patterned as shown in FIGS. 11F and 11N to define electrodes 122, 123, 152 and 153 and electrical traces 182 and 183.

Fabrication of the embodiment of band-pass filter 200 with an acoustic decoupling layer of a crosslinked polyphenylene polymer as its acoustic decoupler is completed by performing the processing described above with reference to FIGS. 11G, 11H, 11O and 11P.

In an exemplary embodiment, the precursor solution for the crosslinked polyphenylene polymer was one sold by The Dow Chemical Company and designated SiLK™ J. Alternatively, the precursor solution may be any suitable one of the precursor solutions sold by The Dow Chemical Company under the trademark SiLK. In certain embodiments, a layer of an adhesion promoter was deposited before the precursor solution was spun on. Precursor solutions containing oligomers that, when cured, form a crosslinked polyphenylene polymer having an acoustic impedance of about 2 Mrayl may be available from other suppliers now or in the future and may also be used.

An embodiment of band-pass filter 200 in which acoustic decouplers 130, 131, 170 and 171 each incorporate a Bragg structure is made by a process similar to that described above. The process differs as follows:

After a layer 118 of piezoelectric material is deposited and patterned (FIGS. 11C and 11K), a layer of metal is deposited and is patterned to define a high acoustic impedance Bragg element incorporating electrodes 114, 115, 164 and 165, and additionally to define terminal pad 174; connecting pads 188 and 189; and electrical traces 178, 179, 186 and 187, in a manner similar to that described above with reference to FIGS. 11D and 11L. The layer of metal is deposited with a nominal thickness equal to an odd, integral multiple of one quarter of the wavelength in the metal of an acoustic signal equal in frequency to the center frequency of the pass band of band-pass filter 200.

In an exemplary embodiment, the metal deposited to form the high acoustic impedance Bragg element incorporating electrodes 114, 115, 164 and 165 is molybdenum. The molybdenum is deposited with a thickness of about 820 nm (one-quarter wavelength in Mo) by sputtering, and is patterned by dry etching. Other refractory metals may alternatively be used as the material of the high acoustic impedance Bragg element incorporating electrodes 114, 115, 164 and 165. The high acoustic impedance Bragg element may alternatively comprise layers of more than one metal.

A layer of low acoustic impedance material is then deposited and is patterned in a manner similar to that shown in FIGS. 11E and 11M to define a low acoustic impedance Bragg element. The layer of low acoustic impedance material is deposited with a nominal thickness equal to an odd, integral multiple of one quarter of the wavelength in the low acoustic impedance material of an acoustic signal equal in frequency to the center frequency of the pass band of band-pass filter 200. The low acoustic impedance Bragg element is shaped to cover at least the high acoustic impedance Bragg element, and is additionally shaped to expose part of the surface of fill material 194 and terminal pads 132, 134, 172, 173 and 174. The layer of low acoustic impedance material is additionally patterned to define windows that provide access to additional parts of the surface of the fill material.

In the exemplary embodiment, the low acoustic impedance material is $SiO_2$ with a thickness of about 790 nm. The $SiO_2$ is deposited by sputtering, and is patterned by etching. Other low acoustic impedance material that can be used as the material of low acoustic impedance Bragg element include phosphosilicate glass (PSG), titanium dioxide and magnesium fluoride. The low acoustic impedance material can alternatively be deposited by methods other than sputtering.

A layer of metal is deposited and is patterned to define a high acoustic impedance Bragg element incorporating electrodes 122, 123, 152 and 153. The layer of metal is additionally patterned to define electrical trace 182 extending from electrode 122 to electrode 152 and electrical trace 183 extending from electrode 123 to electrode 153, in a manner similar to that shown in FIGS. 11F and 11N. The layer of metal is deposited with a nominal thickness equal to an odd, integral multiple of one quarter of the wavelength in the metal of an acoustic signal equal in frequency to the center frequency of the pass band of band-pass filter 200.

In the exemplary embodiment, the metal deposited to form a high acoustic impedance Bragg element incorporating electrodes 122, 123, 152 and 153 is molybdenum. The molybdenum is deposited with a thickness of about 820 nm (one-quarter wavelength in Mo) by sputtering, and is patterned by dry etching.

Other refractory metals may alternatively be used as the material of the high acoustic impedance Bragg element incorporating electrodes 122, 123, 152 and 153 and its associated electrical traces. The high acoustic impedance Bragg element and electrical traces may alternatively comprise layers of more than one material. A layer of piezoelectric material is then deposited and is patterned to define piezoelectric layer 128, as described above, and the process continues as described above to complete fabrication of band-pass filter 200.

In band-pass filter 200, all four DSBARs, the input terminals, the output terminals, and the electrical circuits interconnecting the DSBARs and the input and output terminals are all located on a common substrate 102. However, this is not critical. A DSBAR-based band-pass filter with a 1:4 impedance ratio may be made by interconnecting two DSBAR-based band-pass filters with a 1:1 impedance ratio. Each DSBAR-based band-pass filter with a 1:1 impedance ratio is similar to that described above with reference to FIGS. 6 and 8A–8C.

Figure 12A:
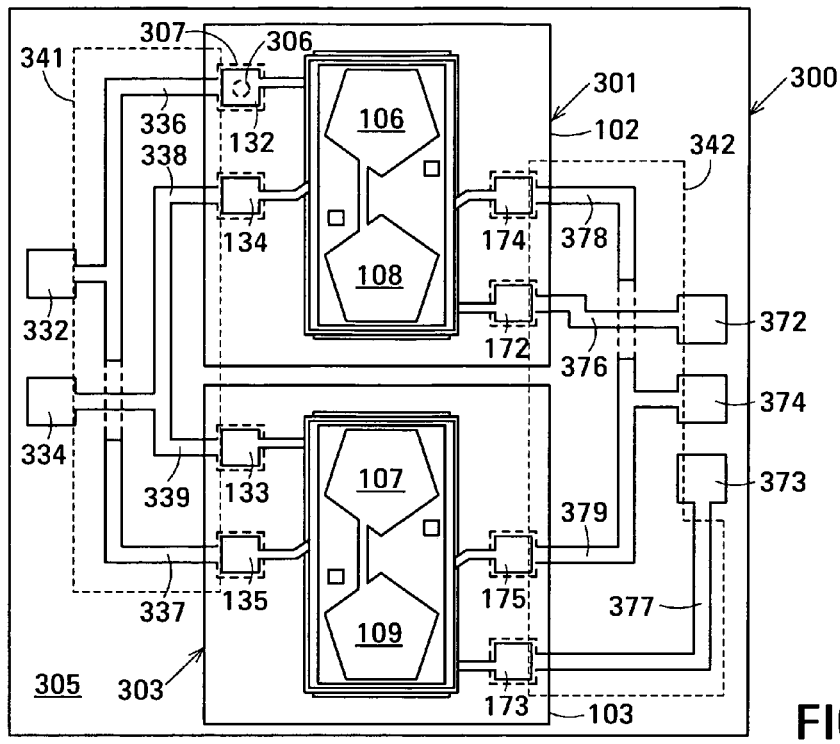
FIGS. 12A–12B are schematic drawings of two versions of a third embodiment of a DSBAR-based band-pass filter in accordance with the invention.

FIG. 12A is a schematic plan view of a third embodiment 300 of a band-pass filter in accordance with the invention. Band-pass filter 300 has first terminals 332 and 334 and second terminals 372, 373 and 374 and a 1:4 ratio between the impedance between first terminals 332, 334 and the impedance between second terminals 372, 373. Band-pass filter 300 additionally has a first filter module 301 and a second filter module 303. First filter module 301 is composed of a first decoupled stacked bulk acoustic resonator (DSBAR) 106 and a second DSBAR 108 electrically connected in series between third terminals 132, 134 and fourth terminals 172, 174. Second filter module 303 is composed of a first DSBAR 107 and a second DSBAR 109 electrically connected in series between third terminals 133, 135 and fourth terminals 173, 175. Each of the filter modules 301 and 303 is similar in structure to band-pass filter 100 described above with reference to FIGS. 6 and 8A–8C and will therefore not be described in detail. Band-pass filter 300 is additionally composed of a first electrical circuit 341 and a second electrical circuit 342. First electrical circuit 341 connects the third terminals 132, 134 of first filter module 301 and the third terminals 133, 135 of second filter module 303 in parallel with first terminals 332, 334. Second electrical circuit 342 connects the fourth terminals 172, 174 of first filter module 301 and the fourth terminals 173, 175 of second filter module 303 in series with second terminals 372, 373. One of first electrical circuit 341 and second electrical circuit 342 comprises a phase-inverting connection.

In the example shown in FIG. 12A, first electrical circuit 341 has the phase-inverting connection. First electrical circuit 341 connects first terminals 332 and 334 to third terminals 132 and 134, respectively, of filter module 301 and connects first terminals 332 and 334 to third terminals 135 and 133, respectively, of filter module 303. An input electrical signal applied between first terminal 332 and 334 appears in phase between third terminals 132 and 134 but appears in anti-phase between third terminals 133 and 135. Consequently, the electrical signal between fourth terminals 172 and 174 is in anti-phase with the electrical signal between fourth terminals 173 and 175.

Second electrical circuit 342 lacks a phase-inverting connection, and connects fourth terminal 172 to second terminal 372, fourth terminal 174 to fourth terminal 175, and fourth terminal 173 to second terminal 373. In the example shown, second electrical circuit 342 additionally connects fourth terminals 174 and 175 to optional center tap second terminal 374. The electrical connection between fourth terminal 174 and fourth terminal 175 and the phase inversion between the electrical signals on fourth terminals 172 and 173 cause the output electrical signal on second terminal 372 to be in anti-phase with the output electrical signal on second terminal 373.

Figure 12B:
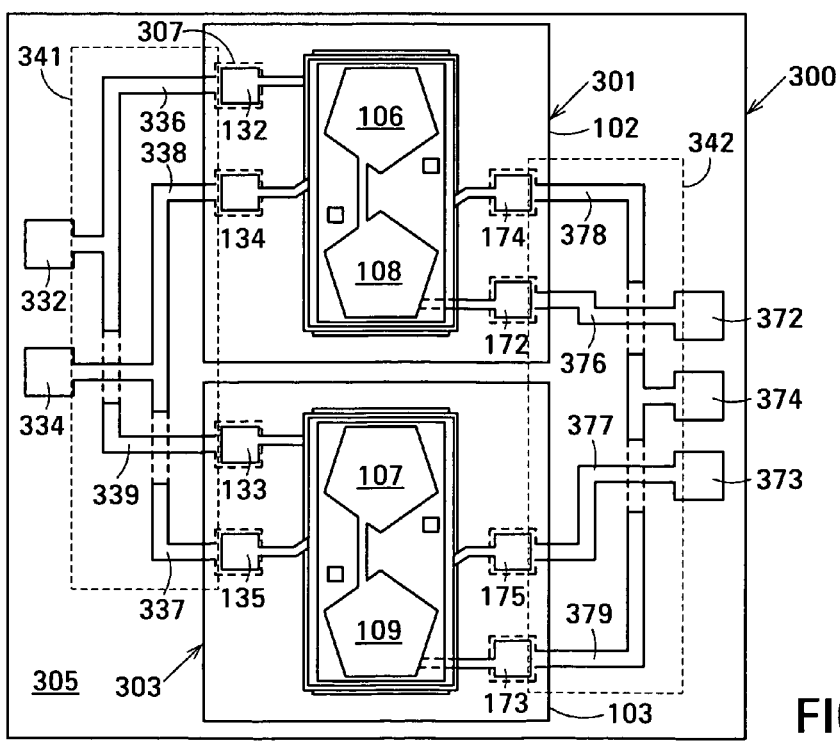

FIG. 12B shows another example of band-pass filter 300 in which second electrical circuit 342 has the phase-inverting connection. Corresponding elements in FIGS. 12A and 12B are indicated by the same reference numerals.

In the example shown in FIG. 12B, first electrical circuit 341 lacks a phase-inverting connection and therefore connects first terminal 332 to third terminals 132 and 133 and connects first terminal 334 to third terminals 134 and 135. An input electrical signal applied between first terminal 332 and 334 appears in phase between third terminals 132 and 134 and between third terminals 133 and 135. Consequently, the electrical signal between fourth terminals 172 and 174 is in phase with the electrical signal between fourth terminals 173 and 175.

Second electrical circuit 342 has the phase-inverting connection. Second electrical circuit 342 connects fourth terminal 172 to second terminal 372, fourth terminal 174 to fourth terminal 173, and fourth terminal 175 to second terminal 373. In the example shown, second electrical circuit 342 additionally connects fourth terminals 174 and 173 to optional center tap second terminal 374. The electrical connection between fourth terminal 174 and fourth terminal 173 and the phase inversion between the electrical signals on fourth terminals 172 and 175 cause the output electrical signal on second terminal 372 to be in anti-phase with the output electrical signal on second terminal 373.

In the examples shown in FIGS. 12A and 12B, filter module 301 has a via extending through substrate 102 from each of the terminals 132, 134, 172, 174 to a respective mounting pad (not shown) on the opposite major surface (not shown) of substrate 102. An exemplary via is shown at 306. Filter module 303 has similar mounting pads (not shown) on the opposite major surface of its substrate. Filter modules 301 and 303 are mounted on a printed circuit board 305, which is typically a multi-layer printed circuit board. Alternatively, filter modules 301 and 303 are mounted on another type of substrate such as a ceramic substrate or a semiconductor substrate. First terminals 332 and 334 and second terminals 372, 373 and 374 are defined in an exposed metal layer of printed circuit board 305. Also defined in the exposed metal layers of printed circuit board 305 are mounting pads aligned with the terminals 132–135 and 172–175 of filter modules 301 and 303. An exemplary mounting pad is shown at 307. Additionally traces 336, 337, 338, 339, 377, 377, 378 and 379 are defined in the metal layers of printed circuit board 305.

Filter modules 301 and 303 are surface mounted on printed circuit board 305 with their mounting pads (not shown) in contact with corresponding mounting pads of the printed circuit board. Filter modules 301 and 303 are shown as separate modules, but could alternatively be fabricated on a common substrate that is mounted on printed circuit board 305 as just described.

In the example shown in FIG. 12A, in electrical circuit 341, trace 336 extends between first terminal 332 and the mounting pad aligned with third terminal 132, trace 337 extends between first terminal 332 and the mounting pad aligned with third terminal 135, trace 338 extends between first terminal 334 and the mounting pad aligned with third terminal 134 and trace 339 extends between first terminal 334 and the mounting pad aligned with third terminal 133. In electrical circuit 342, trace 376 extends between second terminal 372 and the mounting pad aligned with fourth terminal 172; trace 377 extends between second terminal 373 and the mounting pad aligned with fourth terminal 173; and traces 378 and 379 interconnect the mounting pad aligned with fourth terminal 174 and the mounting pad aligned with fourth terminal 175 and additionally connect these mounting pads and optional second terminal 374.

In the example shown in FIG. 12B, in electrical circuit 341, trace 336 extends between first terminal 332 and the mounting pad aligned with third terminal 132, trace 337 extends between first terminal 332 and the mounting pad aligned with third terminal 133, trace 338 extends between first terminal 334 and the mounting pad aligned with third terminal 134, and trace 339 extends between first terminal 334 and the mounting pad aligned with third terminal 135. In electrical circuit 342, trace 376 extends between second terminal 372 and the mounting pad aligned with fourth terminal 172, trace 377 extends between second terminal 373 and the mounting pad aligned with fourth terminal 175, and traces 378 and 379 interconnect the mounting pad aligned with fourth terminal 174 and the mounting pad aligned with fourth terminal 173 and additionally connect these mounting pads to optional second terminal 374.

First terminals 332, 334 may be designated as input terminals, in which case, second terminals 372, 373 and, optionally, 374 are designated output terminals. Alternatively, first terminals 332 and 334 may be designated output terminals, in which case, second terminals 372, 373 and, optionally, 374 are designated input terminals.

This disclosure describes the invention in detail using illustrative embodiments. However, the invention defined by the appended claims is not limited to the precise embodiments described.

We claim:

1. A band-pass filter, comprising:
   first terminals;
   second terminals;
   a first decoupled stacked bulk acoustic resonator (DSBAR), a second DSBAR, a third DSBAR, and a fourth DSBAR, each DSBAR comprising a first film bulk acoustic resonator (FBAR), a second FBAR and an acoustic decoupler between the FBARs, each FBAR comprising opposed planar electrodes and a piezoelectric element between the electrodes;
   a first electrical circuit connecting the first DSBAR and the second DSBAR in series between the first terminals and the second terminal; and
   a second electrical circuit configured to connect the third DSBAR and the fourth DSBAR in series between the first terminals and the second terminals; and
   one of the first electrical circuit and the second electrical circuit is phase-inverting relative to the other.

2. The band-pass filer of claim 1, in which:
   the first DSBAR, the second DSBAR, the first terminals, the second terminals and the first electrical circuit constitute a first filter module;
   the band-pass filter additionally comprises a second filer module, comprising:
   third terminals;
   fourth terminals;
   wherein said second electrical circuit connects the third DSBAR and the fourth DSBAR in series between the third terminals and the fourth terminals,
   a third electrical circuit connecting the first terminals and the third terminals in parallel; and
   a fourth electrical circuit connecting the second terminals and the fourth terminals in series, one of the third electrical circuit and the fourth electrical circuit comprising a phase-inverting connection.

3. A band-pass filter, comprising:
   first terminals;
   second terminals;
   a first decoupled stacked bulk acoustic resonator (DSBAR), a second DSBAR, a third DSBAR and a fourth DSBAR, each DSBAR comprising a first film bulk acoustic resonator (FBAR), a second FBAR and an acoustic decoupler between the FBARs, each FBAR comprising a first electrode, a second electrode and a piezoelectric element between the electrodes;
   a first electrical circuit connecting the first DSBAR and the second DSBAR in series between the first terminals and the second terminals; and
   a second electrical circuit connecting the third DSBAR and the fourth DSBAR in series between the first terminals and the second terminals, one of the first electrical circuit and the second electrical circuit being phase-inverting relative to the other.

4. The band-pass filter of claim 3, in which the first electrical circuit comprises a phase-inverting connection.

5. The band-pass filter of claim 3, in which the second electrical circuit comprises a phase-inverting connection.

6. The band-pass filter of claim 3, in which:
   the first electrical circuit and the second electrical circuit collectively comprise phase-inverting connections; and
   the phase-inverting connections differ in number by an odd number between the first electrical circuit and the second electrical circuit.

7. The band-pass filter of claim 3, in which one of the first electrical circuit and the second electrical circuit comprises an electrical connection between electrodes on opposite sides of a common piezoelectric layer.

8. The band-pass filter of claim 3, in which:
   the piezoelectric elements are each characterized by a c-axis direction; and
   at least one the piezoelectric elements has a c-axis direction opposite the c-axis directions of the remaining piezoelectric elements to provide the phase inversion.

9. The band-pass filter of claim 3, in which:
   the first electrical circuit connects one of the first terminals to an electrode on a first side of a piezoelectric layer and connects another of the first terminals to an electrode on a second side of the piezoelectric layer, the second side opposite the first side; and the second electrical circuit connects the one of the first terminals to an electrode on the second side of the piezoelectric layer and additionally connects the other of the first terminals to an electrode on the first side of the piezoelectric layer.

10. The band-pass filter of claim 3, in which the acoustic decouplers comprise a layer of acoustic decoupling material.

11. The band-pass filter of claim 10, in which the acoustic decoupling material comprises polyimide.

12. The band-pass filter of claim 10, in which the acoustic decoupling material comprises a crosslinked polyphenylene polymer.

13. A band-pass filter, comprising:
first terminals;
second terminals;
a first filter module and a second filter module, each filter module comprising:
third terminals;
fourth terminals; and
a first decoupled stacked bulk acoustic resonator (DSBAR) and a second DSBAR electrically connected in series between the third terminals and the fourth terminals;
a first electrical circuit connecting the third terminals of the first filter module and the third terminals of the second filter module in parallel with the first terminals; and
a second electrical circuit connecting the fourth terminals of the first filter module and the fourth terminals of the second filter module in series with the second terminals, one of the electrical circuits comprising a phase-inverting connection.

14. The band-pass filter of claim 13, in which the first electrical circuit comprises the phase-inverting connection.

15. The band-pass filter of claim 13, in which the second electrical circuit comprises the phase-inverting connection.

16. The band-pass filter of claim 13, in which:
each of the DSBARs comprises a first FBAR, a second FBAR stacked on the first FBAR, and an acoustic decoupler between the FBARs;
each of the FBARs comprises opposed planar electrodes and a piezoelectric element between the electrodes; and
the piezoelectric elements of the first FBARs are portions of a common piezoelectric layer.

17. The band-pass filter of claim 16, in which:
the first electrical circuit connects each of the first terminals to ones of the third terminals connected to electrodes located on opposite sides of the piezoelectric layer; and
the second electrical circuit connects each of the second terminals to ones of the fourth terminals connected to electrodes on the same side of the piezoelectric layer.

18. The band-pass filter of claim 16, in which:
the first electrical circuit connects each of the first terminals to ones of the third terminals connected to electrodes located on the same side of the piezoelectric layer; and
the second electrical circuit connects each of the second terminals to ones of the fourth terminals connected to electrodes on opposite sides of the piezoetectric layer.

19. The band-pass filter of claim 16, in which the acoustic decoupler comprises a layer of acoustic decoupling material.

* * * * *

UNITED STATES PATENT AND TRADEMARK OFFICE
CERTIFICATE OF CORRECTION

PATENT NO. : 7,242,270 B2  Page 1 of 1
APPLICATION NO. : 11/069409
DATED : July 10, 2007
INVENTOR(S) : John Larson It is certified that error appears in the above-identified patent and that said Letters Patent is hereby corrected as shown below:

Col. 24 Line 3 In Claim 1, delete "terminal;" and insert -- terminals; --, therefor.

Col. 24 Line 9 In Claim 2, delete "filer" and insert -- filter --, therefor.

Col. 24 Line 13 In Claim 2, delete "filer" and insert -- filter --, therefor.

Col. 24 Line 61 In Claim 8, after "one" insert -- of --.

Col. 26 Line 30(Approx.) In Claim 18, delete "piezoetectric" and insert -- piezoelectric --, therefor.

Signed and Sealed this

Sixteenth Day of December, 2008

JON W. DUDAS
*Director of the United States Patent and Trademark Office*